US009812795B2

(12) United States Patent
Palaniappa et al.

(10) Patent No.: US 9,812,795 B2
(45) Date of Patent: Nov. 7, 2017

(54) PACKAGED DEVICE ADAPTER WITH FORCE APPLIED USING BEARING APPARATUS

(71) Applicant: IRONWOOD ELECTRONICS, INC., Eagan, MN (US)

(72) Inventors: Ilavarasan M. Palaniappa, Eagan, MN (US); Mickiel P. Fedde, Eagan, MN (US); Vinayak Reddy Panavala, Shakopee, MN (US); Jacob Ray Vavra, Minneapolis, MN (US)

(73) Assignee: IRONWOOD ELECTRONICS, INC., Eagan, MN (US)

( * ) Notice: Subject to any disclaimer, the term of this patent is extended or adjusted under 35 U.S.C. 154(b) by 70 days.

(21) Appl. No.: 14/930,726

(22) Filed: Nov. 3, 2015

(65) Prior Publication Data
US 2017/0125922 A1 May 4, 2017

(51) Int. Cl.
H01R 4/50 (2006.01)
H01R 4/38 (2006.01)
H01R 12/50 (2011.01)
H01R 12/72 (2011.01)
H01R 12/89 (2011.01)
H05K 7/10 (2006.01)

(52) U.S. Cl.
CPC ............ H01R 4/5066 (2013.01); H01R 4/38 (2013.01); H01R 12/727 (2013.01); H01R 12/89 (2013.01); H01R 23/6893 (2013.01); H05K 7/1007 (2013.01)

(58) Field of Classification Search
CPC .... H01R 12/89; H01R 4/5066; H01R 12/727; H05K 7/1007
See application file for complete search history.

(56) References Cited

U.S. PATENT DOCUMENTS

| 4,420,203 | A | * | 12/1983 | Aug | .................. H01L 23/32 |
| | | | | | 257/E23.084 |
| 4,460,223 | A | | 7/1984 | Brown et al. | |
| 5,730,620 | A | | 3/1998 | Chan et al. | |
| 5,738,531 | A | * | 4/1998 | Beaman ............... G01R 1/0483 |
| | | | | | 257/E23.067 |
| 5,791,914 | A | | 8/1998 | Loranger et al. | |
| 5,793,618 | A | * | 8/1998 | Chan .................. H01R 13/6215 |
| | | | | | 257/726 |
| 5,892,245 | A | | 4/1999 | Hilton | |
| 5,997,316 | A | * | 12/1999 | Kunzel ............... G01R 1/0483 |
| | | | | | 439/331 |
| 6,341,970 | B1 | * | 1/2002 | Ho ..................... H01R 13/2421 |
| | | | | | 439/266 |
| 6,394,820 | B1 | | 5/2002 | Palaniappa et al. | |
| 6,497,582 | B1 | * | 12/2002 | Hoffmeyer ............ H01R 12/57 |
| | | | | | 439/71 |
| 6,533,589 | B1 | | 3/2003 | Palaniappa et al. | |

(Continued)

Primary Examiner — James Harvey
(74) Attorney, Agent, or Firm — Mueting, Raasch & Gebhardt, P.A.

(57) ABSTRACT

An adapter apparatus and method includes using an adapter body defining a socket cavity configured to receive a packaged device and a torque applicator configured to apply an axial force. A bearing structure positioned between the torque applicator and a packaged device may be used to transfer a force (e.g., an axial force) applied using the torque applicator to the packaged device.

28 Claims, 14 Drawing Sheets

(56) References Cited

U.S. PATENT DOCUMENTS

| | | | |
|---|---|---|---|
| 6,676,429 B1 * | 1/2004 | McHugh | H05K 7/1061 439/331 |
| 6,910,898 B2 * | 6/2005 | Suzuki | H05K 7/1023 439/66 |
| 6,981,882 B1 * | 1/2006 | Palaniappa | H05K 7/1053 439/73 |
| 7,565,843 B2 | 7/2009 | Palaniappa et al. | |
| 2007/0254500 A1 * | 11/2007 | Chiang | H01R 4/5066 439/71 |
| 2008/0053244 A1 * | 3/2008 | Palaniappa | G01L 5/24 73/862.08 |
| 2014/0199873 A1 * | 7/2014 | Liu | H01L 23/32 439/345 |
| 2015/0171527 A1 * | 6/2015 | Krithivasan | H01R 13/447 439/135 |
| 2015/0355234 A1 | 12/2015 | Palaniappa | |

* cited by examiner

PACKAGED DEVICE ADAPTER WITH FORCE APPLIED USING BEARING APPARATUS

BACKGROUND

The present disclosure relates to electrical adapters and methods using such adapters. More particularly, the present disclosure pertains to employing bearing structures in adapters for packaged integrated circuit devices (e.g., micro lead frame packages, micro lead chip carriers, quad flat no lead packages, and micro ball grid array packages, etc.) and methods for using such adapters.

Certain types of integrated circuit packages are becoming increasingly popular due to their occupancy area efficiency. In other words, they occupy less area on a target board on which they are mounted while providing a high density of contact terminals. For example, one such high density package type is a micro lead frame package. Generally, such packages contain an integrated circuit having its die bond pads electrically connected to respective conductive contact lead elements (e.g., lands) that are distributed on a surface of the package (e.g., the bottom surface of the package, for example, in an array).

A target printed circuit board upon which the package is to be mounted typically has formed on its surface a corresponding array of conductive pads which are aligned with the conductive contact lead elements of the package for electrically mounting the package on the target board. The target board typically includes other conductive traces and elements which lead from the array of conductive pads used for mounting the package to other circuitry on the board for connecting various components mounted thereon.

Typically, to mount such a package to a target board, solder material (e.g., solder balls) is provided in a manner corresponding to the array of conductive pads on the target board. The package is positioned with the contact lead elements in contact with the solder material corresponding to the array of conductive pads on the target board. The resulting structure is then heated until the solder material is melted and fused to the contact lead elements of the package.

Such area efficient packaging, e.g., micro lead frame packages or micro ball grid array packages, provide a high density of terminals at a very low cost. Also, this packaging provides for limited lead lengths. The limited lead lengths may reduce the risk of damage to such leads of the package, may provide for higher speed product, etc.

Generally, circuit boards and/or components mounted thereon are tested by designers as the circuit boards are being developed. For example, for a designer to test a circuit board and/or a package mounted thereon, the designer must first electrically connect the package to the target circuit board (e.g., using solder balls).

As described above, this may include mounting the package on the target board and heating the solder material (e.g., solder spheres) to fuse the solder material to the contact lead elements of the package. Therefore, the package may be prevented from being used again. It is desirable for various reasons to use packaged device adapters for mounting the packages and reuse such packages after testing. For example, such device packages may be relatively expensive. Further, for example, once attached, the solder material and/or the contact lead elements (e.g., land pads) are not accessible for testing. In addition, it is often difficult to rework the circuit board with the packages soldered thereon.

Various adapters are available for use in electrically connecting a package to a target board for one or more purposes. For example, U.S. Pat. No. 7,565,843 to Palaniappa et al., entitled "Packaged Device Adapter With Torque Indicating Assembly," issued 28 Jul. 2009; U.S. Pat. No. 6,533,589 to Palaniappa et al., entitled "Packaged Device Adapter Assembly," issued 18 Mar. 2003; U.S. Pat. No. 6,394,820 to Palaniappa et al., entitled "Packaged Device Adapter Assembly And Mounting Apparatus," issued 28 May 2002; U.S. Pat. No. 5,791,914 to Loranger et al., entitled "Electrical Socket With Floating Guide Plate," issued 11 Aug. 1998; U.S. Pat. No. 4,460,223 to Brown et al., entitled "Cover For Chip Carrier Socket," issued 17 Jul. 1984; U.S. Pat. No. 5,892,245 to Hilton, entitled "Ball grid Array Package Emulator," issued 6 Apr. 1999; and U.S. Pat. No. 5,730,620 to Chan et al., entitled "Method And Apparatus For Locating Electrical Circuit Members," issued 24 Mar. 1998, all describe various adaptors that are used for mounting or locating packaged devices.

Many of such adaptors use mechanisms for applying force or pressure on the packaged devices such that electrical contact of the packaged device conductive pads (e.g., pads on the bottom surface of the device) to corresponding contacts (e.g., a conductive elastomer or other arrangement of conductive elements, or further target board conductive land pads) is achieved. However, the mechanisms for applying such a force, at least in many circumstances, may result in a relatively large amount of friction between components within the adaptor, for example, between a compression screw and a packaged device. For example, as shown in U.S. Pat. No. 6,533,589 to Palaniappa et al., a screw or actuator element is used to apply a force to a floating member which is in direct contact with the packaged device to achieve adequate contact between contact pads of the packaged device and a conductive elastomer layer. In one or more cases, the actuator element or screw may cause undesirable friction with respect to the floating member, and as such the packaged device, when tightened.

SUMMARY

The present disclosure provides a bearing structure that, for example, may be employed in a packaged device adapter for use in mounting or locating high density integrated circuit packages (e.g., micro lead frame packages, micro lead chip carriers, quad flat no lead packages, and micro ball grid array packages, etc.).

One exemplary embodiment of an adapter apparatus according to the present disclosure is for use with a packaged device having a plurality of contact elements disposed on a surface thereof. The adapter apparatus may include an adapter body defining a socket cavity configured to receive a packaged device such that the plurality of contact elements of the packaged device are at least aligned with arranged conductive elements corresponding thereto and a torque applicator configured to apply an axial force (e.g., wherein the torque applicator includes a contact surface). Further, a compression assembly that includes a bearing structure is positioned between the contact surface of the torque applicator and a packaged device when received in the socket cavity to transfer an axial force applied using the torque applicator to the packaged device.

In one or more embodiments of the adapter apparatus, the adapter body defining a socket cavity configured to receive a packaged device may include a threaded opening, the torque applicator includes a threaded torque applicator extending along an axis of the adapter apparatus may include a threaded portion configured to mate with the threaded opening of the adapter body for use in applying an axial force, the threaded torque applicator may terminate at the contact surface, and the bearing structure of the compression assembly may be positioned between the contact surface of the torque applicator and a packaged device when received in the socket cavity to transfer an axial force applied using the threaded torque applicator to the packaged device.

Further, in one or more embodiments of the adapter apparatus, the bearing structure may include a horizontal bearing defined about an axis thereof that lies in the same direction as the axis of the adapter apparatus. Further, for example, the bearing structure may include a thrust bearing structure positioned to transfer an axial force applied using the torque applicator to the packaged device when received in the socket cavity. Still further, for example, the thrust bearing structure may include a first race comprising an inner surface and an outer surface opposite the inner surface, a second race comprising an inner surface and an outer surface opposite the inner surface, and a plurality of bearing elements positioned between the inner surface of the first race and the inner surface of the second race (e.g., the outer surface of the first race may be positioned to receive an axial force applied from the torque applicator, and further the bearing structure may transfer the force to the packaged device via the outer surface of the second race).

Further, in one or more embodiments of the adapter apparatus, the bearing structure may include a rotary rolling element bearing structure positioned to transfer an axial force applied using the torque applicator to the packaged device when received in the socket cavity. For example, the bearing structure may include a first race ring having an inner surface comprising a first groove to receive a plurality of ball bearings and an outer planar surface opposite the inner surface and a second race ring having an inner surface comprising a second groove to receive the plurality of ball bearings and an outer planar surface opposite the inner surface. Further, the bearing structure may include a bearing ring supporting a plurality of ball bearings (e.g., the plurality of ball bearings may be held between the first race ring and the second race ring in the first groove and second groove thereof). Further, for example, the outer planar surface of the first race may be positioned to receive an axial force applied from the contact surface of the torque applicator, and the bearing structure may transfer the force to the packaged device via the outer planar surface of the second race.

Still further, in one or more embodiments, the compression assembly may further include a compression plate apparatus positioned between the bearing structure and a packaged device when received in the socket cavity such that an axial force applied using the torque applicator is transferred through the bearing structure and via the compression plate apparatus to the packaged device when received in the socket cavity. For example, the compression plate apparatus may include one or more plate elements forming a compression plate body having a first surface configured to contact a packaged device when received in the socket cavity and a second surface opposite the first surface and a cavity defined in the second surface configured to receive the bearing structure (e.g., at least a contact surface of the bearing structure may extend beyond the second surface such that an axial force applied by the torque applicator to the compression assembly is applied to contact surface of the bearing structure instead of the second surface of the compression body).

Still further, in one or more embodiments, the adapter body defining a socket cavity may include a socket base defining the socket cavity therein configured to receive a packaged device and a socket lid to close the socket cavity hinged to the socket base (e.g., wherein the socket lid may include the threaded opening for mating with the threaded portion of the threaded torque applicator).

In one or more other embodiments adapter apparatus, the adapter body defines the socket cavity along an axis of the adapter apparatus and the torque applicator includes a hinged torque applicator coupled to the adapter body for use in applying an axial force (e.g., wherein the hinged torque applicator may include a movable lever portion coupled to a pair of cam portions providing contact surfaces on opposing sides of the adapter body). Further, the bearing structure of the compression assembly may include a pair of bearings with each bearing of the pair positioned between a contact surface of a cam portion and a packaged device when received in the socket cavity to transfer an axial force applied using the hinged torque applicator to the packaged device.

Further, in one or more embodiments, the pair of bearings may include a pair of vertical bearings, each vertical bearing defined about an axis thereof which lies orthogonal to the axis of the adapter apparatus. Further, for example, each of the pair of bearings may include a thrust bearing structure positioned to transfer an axial force applied using the hinged torque applicator to the packaged device when received in the socket cavity. For example, each thrust bearing structure may include a first circular race including an inner circular surface adjacent an axis extending therethrough and an outer circular surface opposite the inner circular surface, a second circular race including an inner circular surface and an outer circular surface opposite the inner circular surface, and a plurality of bearing elements positioned between the outer circular surface of the first race and the inner surface of the second race (e.g., wherein the outer circular surface of the second circular race may be positioned to receive an axial force applied from the hinged torque applicator, and further wherein the thrust bearing structure may transfer the force to the packaged device via the inner circular surface of the first race). Further, for example, each thrust bearing structure may include a rotary rolling element bearing structure positioned to transfer an axial force applied using the hinged torque applicator to the packaged device when received in the socket cavity.

Further, in one or more embodiments, the compression assembly may further include a compression plate apparatus coupled between the pair of bearings, wherein the compression plate apparatus may include a surface configured to contact a packaged device when received in the socket cavity such that an axial force applied by the pair of cam portions of the hinged torque applicator is applied to the pair of bearings instead of directly to a surface of the compression plate apparatus.

Still further, in one or more embodiments, the adapter body defining a socket cavity may include a socket base defining the socket cavity therein configured to receive a packaged device and a socket lid to close the socket cavity hinged to the socket base (e.g., wherein the lever portion of the hinged torque applicator may be movable relative to the socket lid to apply an axial force by the pair of cam portions to a packaged device when received in the socket cavity via the pair of bearings and the compression plate apparatus).

One exemplary embodiment of a method of loading a packaged device in an adapter apparatus (e.g., wherein the packaged device comprises a plurality of contact elements disposed on a surface thereof) may include providing an adapter body defining a socket cavity configured to receive a packaged device, providing a torque applicator to apply an axial force (e.g., wherein the torque applicator may include a contact surface), providing a compression assembly including a bearing structure positioned between the contact surface of the torque applicator and a packaged device when received in the socket cavity, positioning a packaged device in the socket cavity such that the plurality of contact elements of the packaged device are at least aligned with arranged conductive elements corresponding thereto, and transferring an axial force applied using the torque applicator to the packaged device using the bearing structure.

In one or more embodiments of the method, the adapter body may include a threaded opening and providing a torque applicator may include providing a threaded torque applicator extending along an axis of the adapter apparatus comprising a threaded portion configured to mate with the threaded opening of the adapter body for use in applying an axial force, wherein the torque applicator terminates at a contact surface, and further wherein transferring an axial force applied using the torque applicator to the packaged device using the bearing structure may include turning the threaded portion of the threaded torque applicator into the threaded opening of the adapter body and transferring an axial force applied using the threaded torque applicator to the packaged device using the bearing structure.

Another exemplary embodiment of a method of loading a packaged device in an adapter apparatus (e.g., wherein the packaged device may include a plurality of contact elements disposed on a surface thereof, the adapter body may define the socket cavity along an axis of the adapter apparatus, the torque applicator may include a hinged torque applicator coupled to the adapter body for use in applying an axial force, the hinged torque applicator may include a movable lever portion coupled to a pair of cam portions providing contact surfaces on opposing sides of the adapter body, and the bearing structure of the compression assembly may include a pair of bearings with each bearing of the pair positioned between a contact surface of a cam portion and a packaged device when received in the socket cavity to transfer an axial force applied using the hinged torque applicator to the packaged device) may include transferring an axial force applied using the hinged torque applicator to the packaged device using the bearing structure by moving the movable lever portion of the hinged torque applicator to apply an axial force by each of the pair of cam portions to a respective bearing of the pair of bearings.

Further, in one or more embodiments of the methods, providing the adapter body defining a socket cavity may include providing a socket base defining the socket cavity therein configured to receive a packaged device and a socket lid to close the socket cavity hinged to the socket base and further, positioning a packaged device in the socket cavity may include opening the socket lid and positioning a packaged device in the socket cavity such that the plurality of contact elements of the packaged device are at least aligned with arranged conductive elements corresponding thereto and closing and latching the socket lid to the socket base.

In still another embodiment of an adapter apparatus for use with a packaged device having a plurality of contact elements disposed on a surface thereof, the adapter apparatus may include an adapter body defining a socket cavity configured to receive a packaged device such that the plurality of contact elements of the packaged device are at least aligned with arranged conductive elements corresponding thereto, a torque applicator configured to apply an axial force, and a bearing structure positioned between the torque applicator and a packaged device when received in the socket cavity for use in transferring an axial force applied using the torque applicator to the packaged device.

The above summary of the present disclosure is not intended to describe each embodiment or every implementation thereof. Advantages, together with a more complete understanding of the disclosure, will become apparent and appreciated by referring to the following detailed description and claims taken in conjunction with the accompanying drawings.

DETAILED DESCRIPTION OF THE EMBODIMENTS

Figure 1:
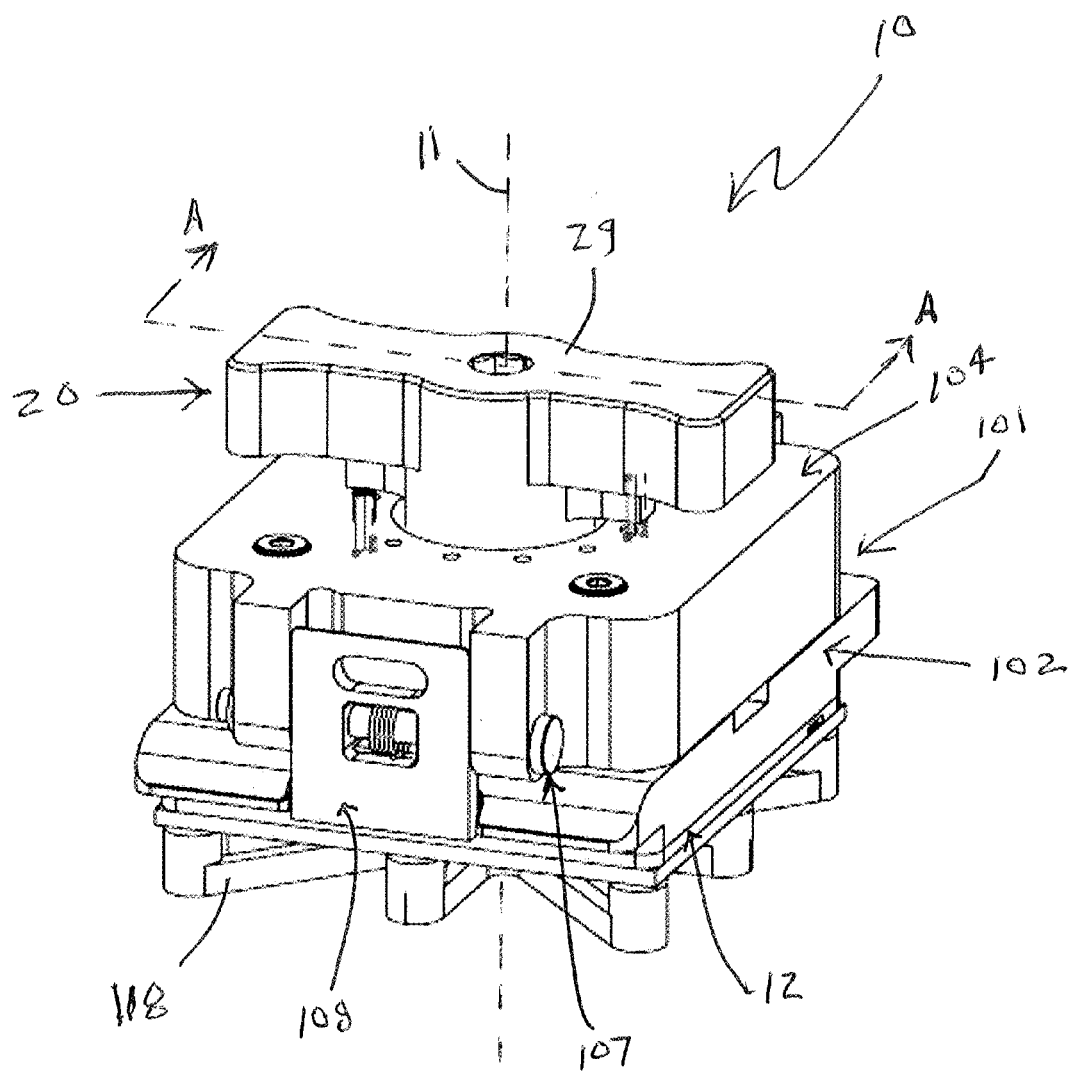
FIG. 1 is a perspective view of an exemplary packaged device adapter apparatus showing an exemplary torque applicator, the apparatus being mounted relative to a target board.

Generally, a packaged device adaptor apparatus for use with packaged devices (e.g., high density devices) which employs a torque applicator and a bearing structure for use in transferring a force applied by the torque applicator to a packaged device is described herein. Illustrative packaged device adaptor apparatus 10 and 200 using bearing structures according to the present disclosure shall be described with reference to FIGS. 1-12.

One skilled in the art will recognize from the description herein that the various illustrative embodiments described include some features or elements included in other illustrative embodiments and/or exclude other features. However, packaged device adaptor apparatus according to the present disclosure may include any combination of elements selected from one or more of the various embodiments as described herein with reference to FIGS. 1-12. For example, as will be readily apparent from the description below, one or more different types of socket bodies, including, for example, a clamshell socket, may be utilized. Further, for example, one or more different types of handles may be used as part of a torque applicator (e.g., levers, graspable, elongated, etc.).

Generally, in one or more embodiments, adapter apparatus described herein are for use with a packaged device having a plurality of contact elements disposed on a surface thereof. For example, the adapter apparatus (e.g., adapter apparatus 10 shown in FIGS. 1-6, adapter apparatus 200 shown in FIGS. 7-12, etc.) include an adapter body defining a socket cavity configured to receive a packaged device such that the plurality of contact elements of the packaged device are at least aligned with arranged conductive elements corresponding thereto. Further, the adapter apparatus may include a torque applicator configured to apply a force, for example, an axial force (e.g., a threaded torque applicator as shown and used in the adapter apparatus 10, a hinged torque applicator as shown and used in the adapter apparatus 200, etc.). For example, the torque applicator may include one or more contact surfaces (e.g., a contact surface terminating the threaded torque applicator; contact surfaces of a pair of cam portions of a hinged torque applicator, etc.) for use in applying the force.

Further, generally, in one or more embodiments, a compression assembly which includes a bearing structure is positioned between one or more contact surfaces of the torque applicator and a packaged device when received in the socket cavity to transfer a force (e.g., an axial force) applied using the torque applicator to the packaged device (e.g., a thrust bearing structure positioned between the contact surface of the torque applicator and a packaged device when received in the socket cavity, a bearing structure positioned between the contact surface of a threaded torque applicator and a packaged device, a pair of bearings each positioned between a contact surface of one of a pair of cam portions of a hinged torque applicator and a packaged device, etc.). The use of the term "between" when defining the positioning of the bearing structure relative to a contact surface and a packaged device is to be interpreted as referring to the path in which a force travels from the torque applicator to the packaged device. For example, in one or more embodiments, the bearing structure need not be in direct contact with either the contact surface or the packaged device, nor positioned between such components of the apparatus along any particular axis (e.g., the force path may lie along multiple axes), but need only be positioned in a path between the contact surface and the packaged device such that a force applied using a torque applicator is transferred to the packaged device via the bearing structure.

Further, for example, as described herein, various different bearing structures may be used for transferring a force applied using a torque applicator to a packaged device received in the adapter apparatus (e.g., horizontal bearing structures having an axis in the same direction as the axis of the adapter apparatus such as used, for example, with the threaded torque applicator, vertical bearing structures having an axis orthogonal to the axis of the adapter apparatus such as used, for example, with the hinged torque applicator, etc.). Still further, one skilled in the art will readily recognize that an adaptor apparatus employed for one or more various purposes (e.g., locating a packaged device on a target board, mounting a packaged device for testing purposes relative to a target board, etc.) may benefit from the features described herein.

One exemplary adapter apparatus 10 including a bearing structure and a threaded torque applicator is shown and shall be described with reference to FIGS. 1-6. Another exemplary adapter apparatus 200 including a bearing structure utilizing a pair of bearings and a hinged torque applicator is shown and shall be described with reference to 7-12.

Figure 2:
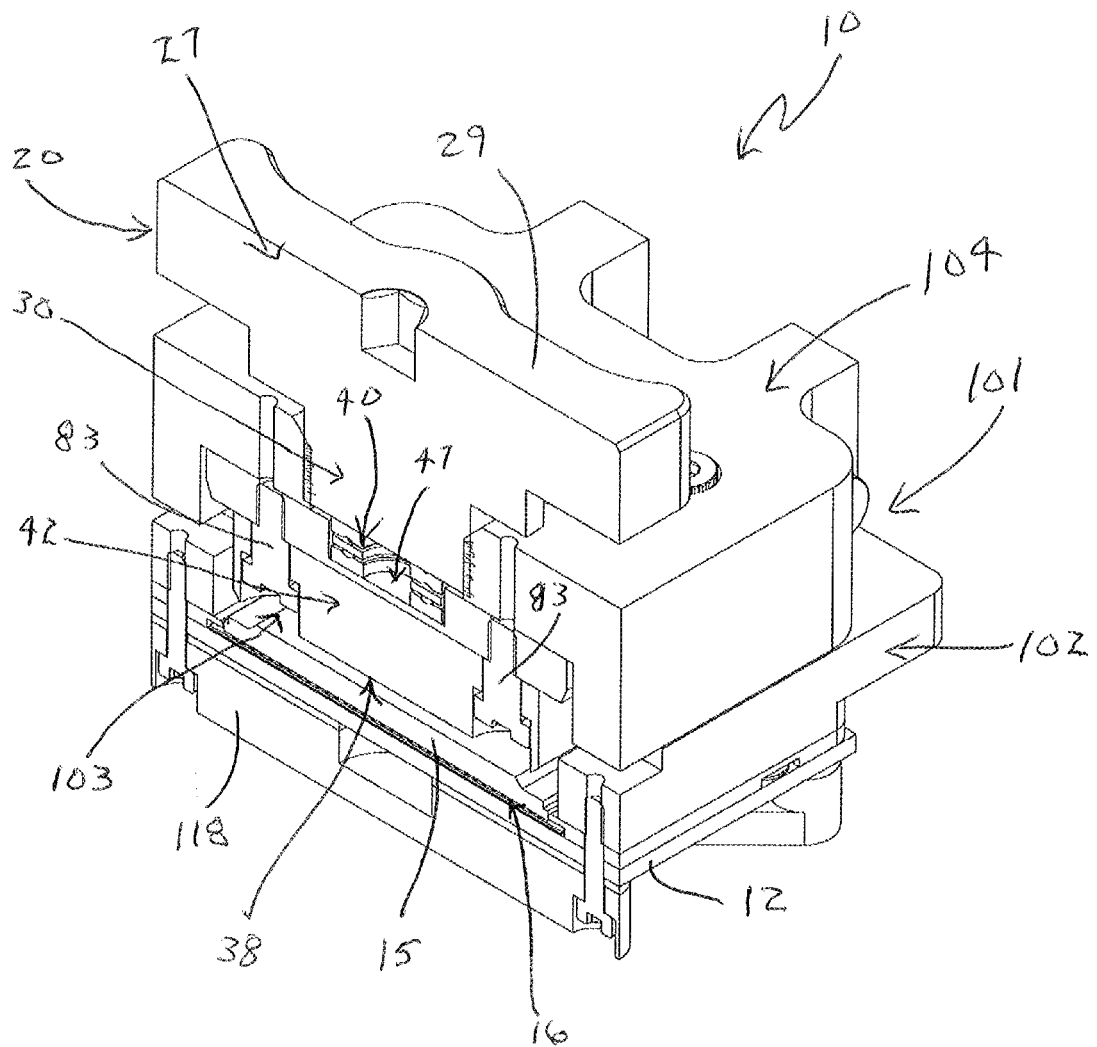
FIG. 2 is a perspective cross-section view of the exemplary packaged device adapter apparatus of FIG. 1 taken along line A-A of FIG. 1.
Figure 3:
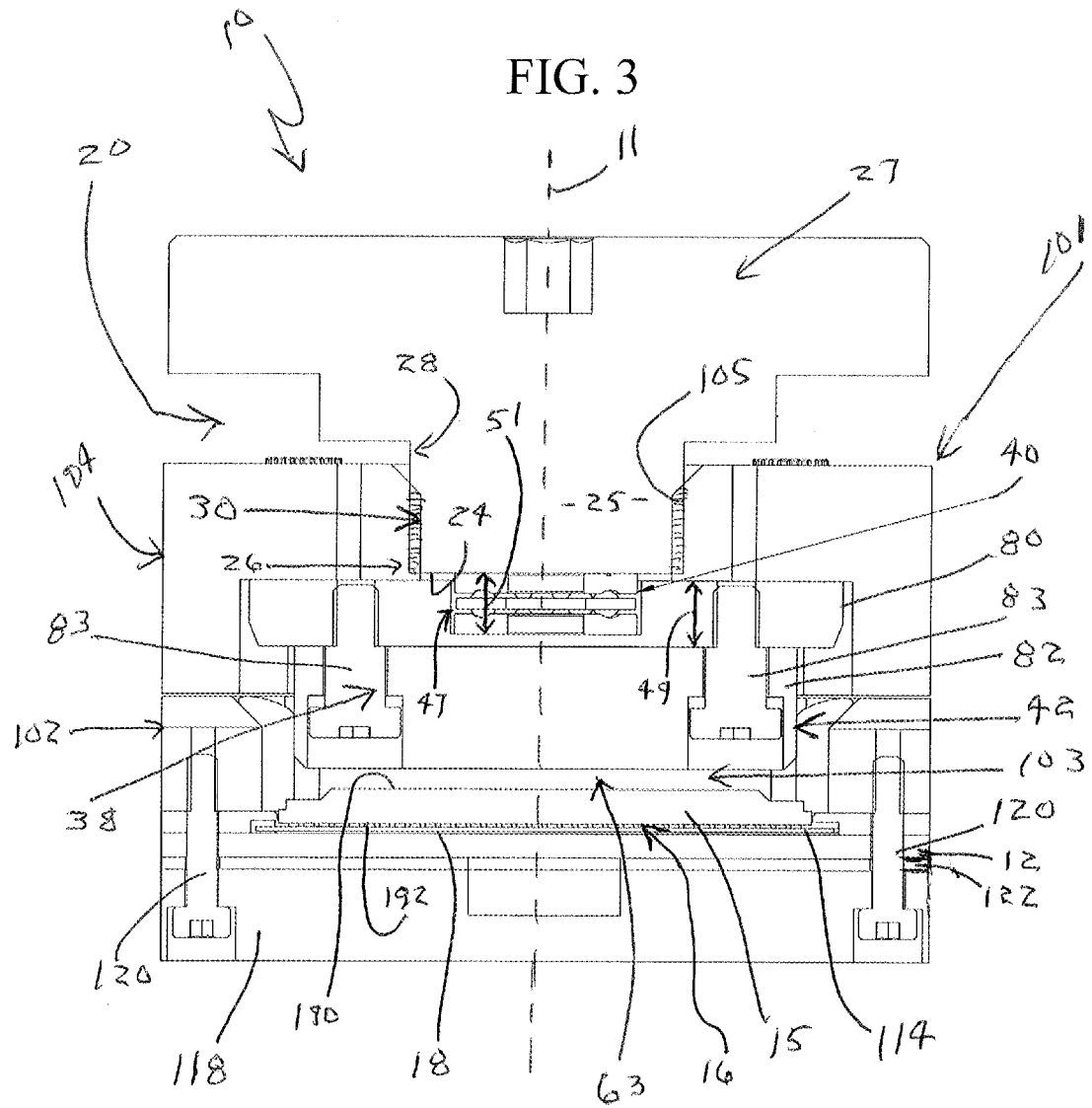
FIG. 3 is a side cross-section view of the exemplary packaged device adapter apparatus of FIG. 1 taken along line A-A of FIG. 1.
Figure 4:
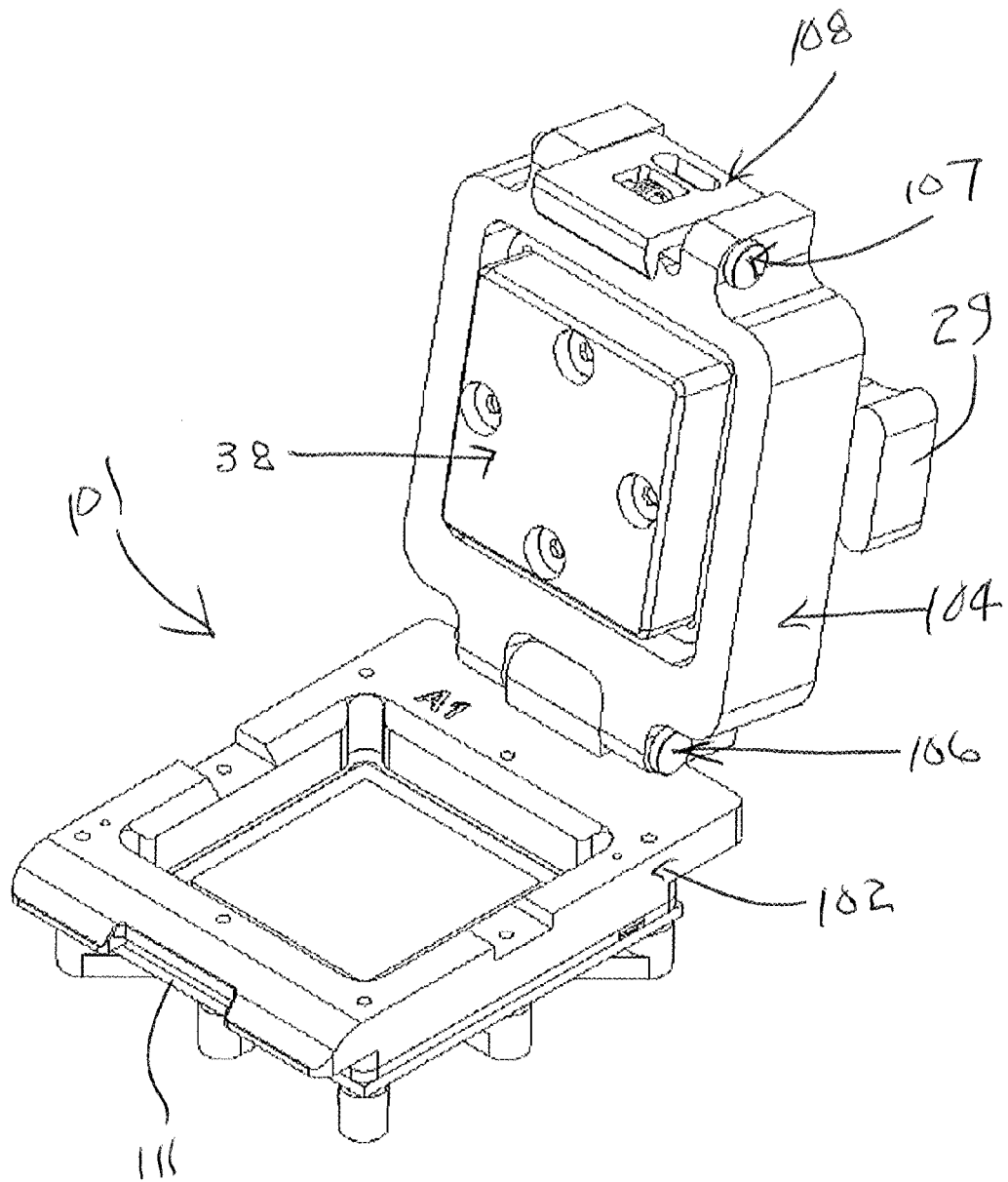
FIG. 4 is a perspective view of a portion of the exemplary packaged device adapter apparatus shown in FIGS. 1-3 with the lid of the adapter body being in an open position.
Figure 5:
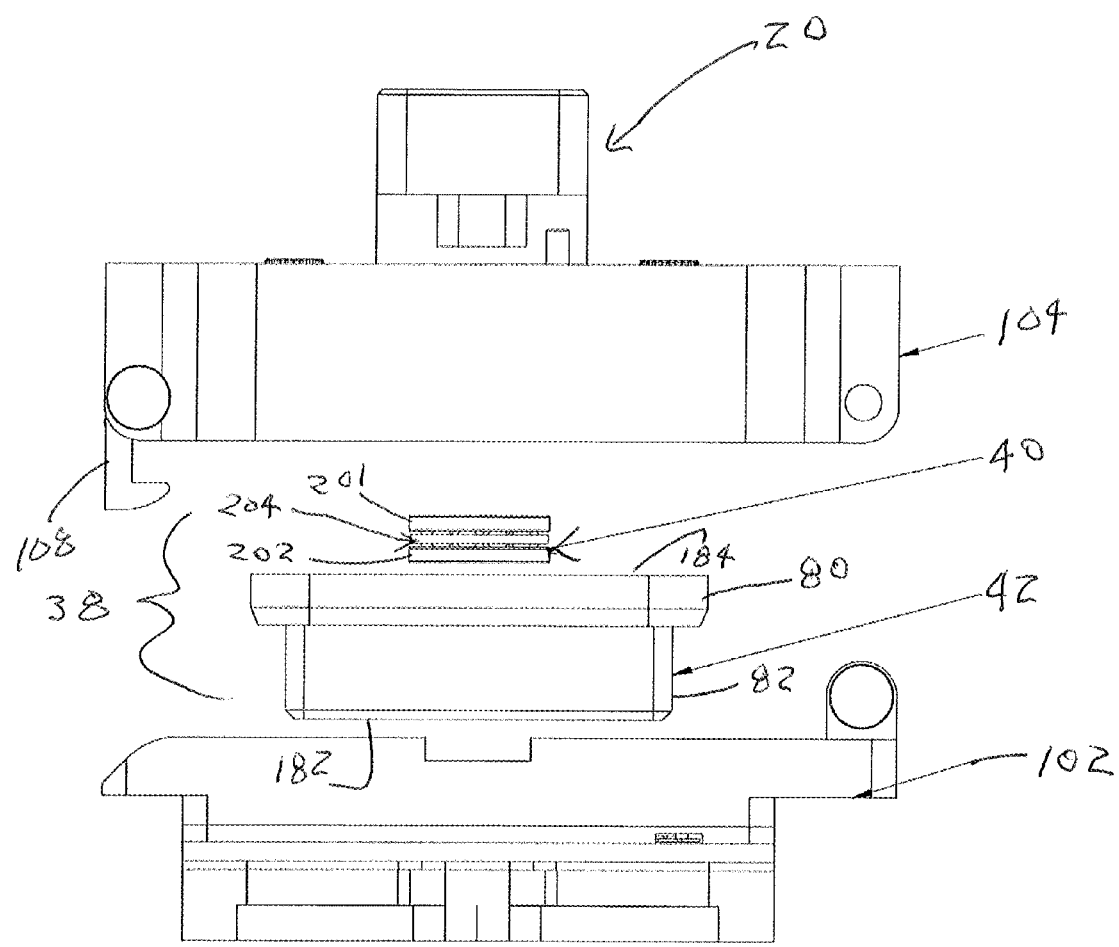
FIG. 5 is an exploded side view of the packaged device adapter apparatus shown in FIGS. 1-4.

FIG. 1 is a perspective view of the exemplary packaged device adaptor apparatus 10 including a threaded torque applicator 20 for use in applying a force to a packaged device when received in the adapter apparatus 10. The exemplary packaged device adaptor apparatus 10 is mounted relative to a target board 12. A perspective cross-section view of the exemplary packaged device adapter apparatus 10 taken along line A-A of FIG. 1 is shown in FIG. 2. A side cross-section view of the exemplary packaged device adapter apparatus 10 taken along line A-A of FIG. 1 is shown in FIG. 3. A perspective view of a portion of the exemplary packaged device adapter apparatus 10 (e.g., an adapter body configured to mate with the torque applicator 20; with the lid of the adapter body being in an open position) is shown in FIG. 4. Still further, an exploded side view of the packaged device adapter apparatus 10 is shown in FIG. 5.

The adaptor apparatus 10 is for use with a packaged device 15 (see FIGS. 2-3) having a plurality of contact elements 16 disposed on a surface (e.g., bottom surface 192) thereof. The adaptor apparatus 10 includes an adaptor body 101 defining a socket cavity 103 (see FIG. 3) configured to receive the packaged device 15 such that the plurality of contact elements 16 of the packaged device 15 are at least aligned with arranged conductive elements (e.g., arranged contacts 18). For example, the conductive elements may include conductive elements which form a portion of adaptor apparatus 10. However, the conductive elements may include other elements in one or more other applications as will be apparent from the description herein, such as, for example, an arranged pattern of contacts 18 on a surface of a target board 12 (see FIG. 3).

The adaptor body 101 further includes a threaded opening 105. The torque applicator 20 is provided for use in applying a force upon the packaged device 15 received in the socket cavity 103 defined by the adaptor body 101. Generally, the torque applicator 20 includes a threaded portion 30 configured to mate with the threaded opening 105 of the adaptor body 101.

In one embodiment, the torque applicator 20 is configured to move the threaded portion 30 thereof into the threaded opening 105 of the adapter body 101. Turning of the torque applicator 20 into the threaded opening 105 asserts a force indirectly onto packaged device 15. For example, a force (e.g., an axial force in the direction of axis 11) may be used to provide the contact elements 16 of the packaged device 15 such that they are in electrical contact with an arrangement of conductive elements (e.g., conductive pin elements) corresponding thereto, an arranged pattern of contacts 18 on a surface of a target board 12 (see FIG. 3), etc., when a certain torque or force has been applied by the torque applicator 20.

The components of the adaptor apparatus 10, including the torque applicator 20, may lie along axis 11. At least in one embodiment, the torque applicator 20 is a cylindrical-like component or assembly that extends along the axis 11 and turns into the threaded opening 105 to apply at least an axial force in the direction of axis 11 (e.g., although certain non-axial forces may be present on the packaged device 15 upon transfer of the axial force thereto through a bearing structure such as described herein). However, at least an axial force applied using the torque applicator 20 is transferred via a bearing structure as described herein. The axis 11 is generally orthogonal, at least in one embodiment, to the target board 12.

The torque applicator 20 according to one embodiment provides an adaptor apparatus 10 (e.g., one or more different configurations of such an adaptor apparatus that includes a threaded opening for mating with such a torque applicator) with the ability to provide a certain force to be applied to a packaged device 15 when mounted within the adaptor body 101. However, if a surface of the torque applicator 20 applies a force directly on the packaged device 15, various problems may result. For example, such force may cause an undesirable friction on the packaged device 15, even if applied indirectly through a compression plate. Such undesirable friction may reduce the life of various portions of the contacts of the packaged device 15 or various conductive elements of the adaptor apparatus 10. As described herein, with use of a bearing structure 40 (see FIGS. 2-3) such friction may be reduced.

The packaged device 15 may be any packaged device having a plurality of contact elements 16 disposed on a surface thereof. In one exemplary embodiment, the packaged device is a device having a high density of contact terminals (e.g., lands, solder spheres, bumps, contact pads, leads, etc.) disposed on the surface thereof. For example, the high density packaged device may be a micro lead frame package, a micro lead chip carrier, a quad flat no-lead package, micro ball grid array package, or any other type of package such as a ball grid array package, a chip scale package, a flip chip package, a flat package, a quad flat package, a small outline package, a land grid array package, or any other package having contact elements disposed on a surface thereof. Although one packaged device 15 is shown in the figures, the present disclosure is in no manner limited to the use of the illustrative adaptor apparatus embodiments described herein with packages that are configured in such a manner. Rather, adaptor apparatus described herein may be used with any packaged device having contact elements disposed on a surface thereof.

In one embodiment, as shown in FIGS. 2-3, packaged device 15 includes an upper surface 190 and a lower surface 192, in addition to one or more side surfaces extending therebetween at the perimeter of the packaged device 15. The plurality of contact elements 16 are disposed at least at the lower surface 192. For example, the contact elements 16 may be distributed in an array along orthogonal X and Y axes, or the contact elements (e.g., lands) may be distributed along the outer portions of the lower surface 192 proximate the perimeter thereof. However, any arrangement of contact elements 16 may be accommodated according to the present disclosure.

The adaptor body 101 may be provided by any number of components that define the socket cavity 103 configured to receive the packaged device 15 therein. At least in one or more embodiments, the packaged device 15 is received within the socket cavity 103 such that the plurality of contact elements 16 of the packaged device 15 are at least aligned with arranged conductive elements corresponding thereto (e.g., pads of a target board, conductive elastomer elements, etc.). Further, the adaptor body 101 includes the threaded opening 105. Apart from being operable to receive the packaged device 15 and including a threaded opening 105, the configuration of the adaptor body 101 may take any number of forms. For example, the adaptor body may include elements such as those found in U.S. Pat. No. 7,565,843, U.S. Pat. No. 6,533,589, U.S. Pat. No. 6,394,820, U.S. Pat. No. 5,791,914, U.S. Pat. No. 4,460,223, U.S. Pat. No. 5,892,245, and/or U.S. Pat. No. 5,730,620. For example, such adaptor bodies may be configured for receiving a packaged device 15 to be located or aligned with contact pads on a target board, may be configured for receiving a packaged device such that the contact elements 16 thereof are positioned adjacent a conductive elastomer, or may include, for example, a clamshell socket body as shown and described generally herein. Although the torque applicator 20 and/or bearing structure 40 are described herein particularly with reference to use with a clamshell socket defining a socket cavity 103, torque applicators and/or bearing structures as described herein may be used with any other adaptor apparatus.

As shown in FIGS. 1-5, the adaptor body 101 (e.g., a clamshell socket) includes a socket base 102 defining the socket cavity 103 therein configured to receive a packaged device 15. The adaptor body 101 further includes a socket lid 104 used to close the socket cavity 103 that is hinged to the socket base 102 using a hinge pin or pins 106. The socket lid 104 includes the threaded opening 105 for mating with the threaded portion 30 of the torque applicator 20.

Further, as shown in FIGS. 1-5, the adaptor body 101 may include a latch mechanism for latching the lid 104 to the socket base 102. In one embodiment, the latch mechanism includes a latch element 108 connected to the socket lid 104 using a latch spring and hinge pin apparatus 107. The latch element 108 engages the socket base 102 at indent 111 achieving a closed and latched state.

The exemplary adaptor shown in FIGS. 1-5 further includes various components. For example, the adaptor apparatus 10 may include a guide layer 114 provided to guide the packaged device 15 and align the packaged device 15 to the arranged conductive elements 18. Further, for example, an insulation plate 122, a backing plate 118, and socket base screws 120 may be provided for mounting the adaptor body 101 relative to the target board 12 (e.g., a printed circuit board).

As previously described herein, the components forming the adaptor body 101 may take one of various different forms, and any particular listing and/or provision of description herein with respect to a particular adaptor body is not to be construed as limiting to the present disclosure. Further, for example, the arrangement of conductive elements to which the contact elements 16 of the packaged device are aligned and provided in electrical contact, may take one of various different types or forms. For example, the arrangement of conductive elements may be provided by a conductive elastomer layer, a pin arrangement structure, a socket arrangement structure, or any other arrangement of conductive elements as would be known to one skilled in the art.

FIGS. 2-5 show the exemplary torque applicator 20 extending along axis 11 of the packaged device adapter apparatus 10 that may be used in a packaged device adapter apparatus 10 such as that shown in FIGS. 1-5 but also which may be used with any number of different adapters having a threaded opening configured for operation with a torque applicator 20. The torque applicator 20 is configured to apply a force (e.g., indirectly through bearing structure 40) upon the packaged device 15 received in the socket cavity 103 of the adapter body 101 and includes the threaded portion 30 configured to mate with the threaded opening 105 of the adapter body 101. The torque applicator 20 terminates at a contact surface 24. Contact surface 24 is configured to provide contact with one or more further components (e.g., such as bearing structure 40 of a compression assembly 38) such that torque (e.g., an axial force) applied using the torque applicator 20 may be transferred to the packaged device 15 when the threaded portion 30 is moved into the threaded opening 105 of the adapter body 101.

At least in one embodiment, the contact surface 24 is a planar surface. Further, for example, the planar surface may be generally orthogonal to the axis 11 of the adapter apparatus 10. However, one or more various configurations of such a contact surface which terminates the torque applicator 20 are contemplated herein depending upon the configuration of the bearing structure. For example, at least in one embodiment, the planar contact surface 24 may be suitable for contact with a bearing structure presenting a generally planar surface. However, any contact surface configuration where the terminating surface mates suitably with a surface of the bearing structure used for transfer of force to the packaged device 15 may be used.

The threaded portion 30 includes a cylindrical body portion 25 extending along the axis 11 of the torque applicator 20 from a first end region 26 to a second end region 28. At least a portion of the outer surface of a cylindrical body portion 25 includes the threaded portion 30 configured to mate with the threaded opening 105 of the adaptor body 101 (see FIGS. 2-3). The first end region 26 includes the lower end contact surface 24 for use in interfacing indirectly with a packaged device 15 received in the socket cavity 103 through bearing structure 40. For example, the lower end contact surface 24 may interface indirectly with the packaged device 15 through use of a compression assembly 38 including, for example, bearing structure 40 and compression plate apparatus 42. The second end region 28 of the cylindrical body portion 25 is provided with a handle apparatus 27 (e.g., which a user may grasp) that may be rotated to turn the threaded portion 30 into the threaded opening 105 of the adapter body 101. For example, in one embodiment, the torque applicator 20 may include a handle 27 that includes an elongated turning element 29 lying orthogonal to axis 11 for allowing a user to easily turn the torque applicator 20.

One will recognize that any torque applicator may be used to provide a force transferable by a contact surface thereof to another component of the adapter apparatus 10. For example, such a torque applicator may be the torque indicating assembly shown in U.S. Pat. No. 7,565,843 which includes a threaded portion that may be configured to mate with threaded opening 105. As such, the present disclosure is not limited to only those torque applicators shown and/or described herein but may include any torque applicator including a threaded portion capable of applying a force via a contact surface thereof.

Force applied using the torque applicator 20 is transferred to the packaged device 15 with use of the compression assembly 38. The compression assembly 38 includes at least a bearing structure 40 positioned between the contact surface 24 of the torque applicator 20 and the packaged device 15 (e.g., positioned between the contact surface 24 of the torque applicator 20 and the compression plate cavity surface 184, wherein the compression plate bottom surface may be in direct contact with the packaged device 15) when received in the socket cavity 103 to transfer an axial force applied using the torque applicator 20 to the packaged device 15.

The bearing structure 40 may include any bearing apparatus configured to transfer an axial force along axis 11 to the packaged device 15. At least in one embodiment, the bearing structure 40 may include a thrust bearing structure to transfer at least the axial force applied using the torque applicator 20 to the packaged device 15. For example, such thrust bearing structures may include thrust ball bearings (e.g., including a plurality of ball bearings supported in a ring); cylindrical thrust roller bearings (e.g., including a plurality of cylindrical rollers arranged flat with their axis pointing to the axis 11); tapered roller thrust bearings (e.g., including a plurality of small tapered rollers arranged so that their axes all converge at a point on the axis 11); spherical roller thrust bearings (e.g., including a plurality of asymmetrical rollers of spherical shape rolling inside a housing washer with a raceway with spherical inner shape); fluid bearings, magnetic bearings, or any other suitable bearing structure providing the ability to transfer at least axial force applied using the torque applicator 20 to the packaged device 15.

The thrust bearing structure 40 may include a plurality of rolling elements in a rolling element bearing structure, wherein the rolling elements ride on races. For example, the thrust bearing structure may include a first race (e.g., 201) including an inner surface and an outer surface opposite the inner surface, a second race (e.g., 202) including an inner surface and an outer surface opposite the inner surface, and a plurality of bearing elements (e.g., ball bearings supported in a ring 204) positioned between the inner surface of the first race (e.g., 201) and the inner surface of the second race (e.g., 202). The outer surface of the first race (e.g., 201) may be positioned to receive a force applied from the torque applicator 20 (e.g., via the contact surface 24). The bearing structure 40 may be configured to suitably transfer the force applied from the torque applicator 20 to the packaged device 15.

Figure 6A:
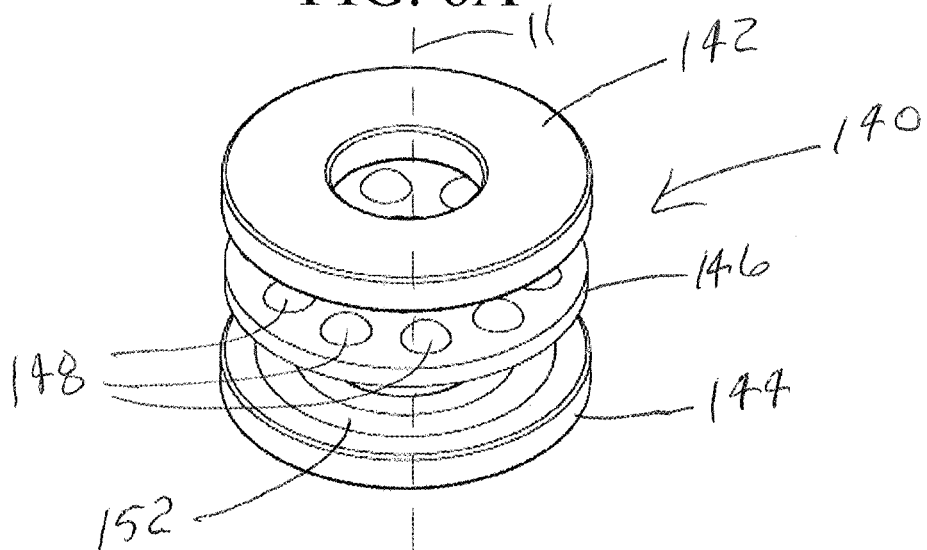
FIGS. 6A-6C are a perspective view, a plan view, and an exploded side view, respectively, of one exemplary embodiment of a bearing structure that may be used in a packaged device adapter apparatus such as shown FIGS. 1-5.
Figure 6B:
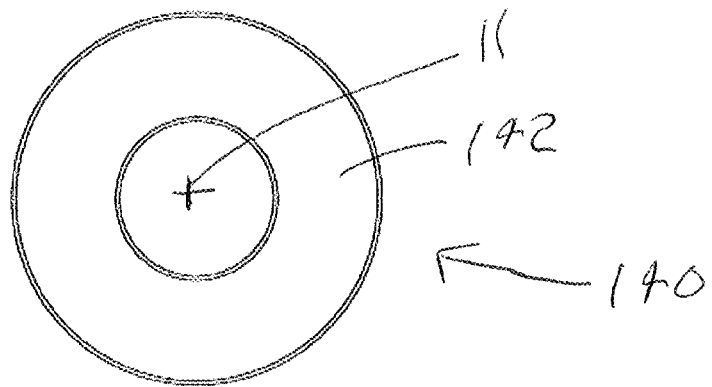
Figure 6C:
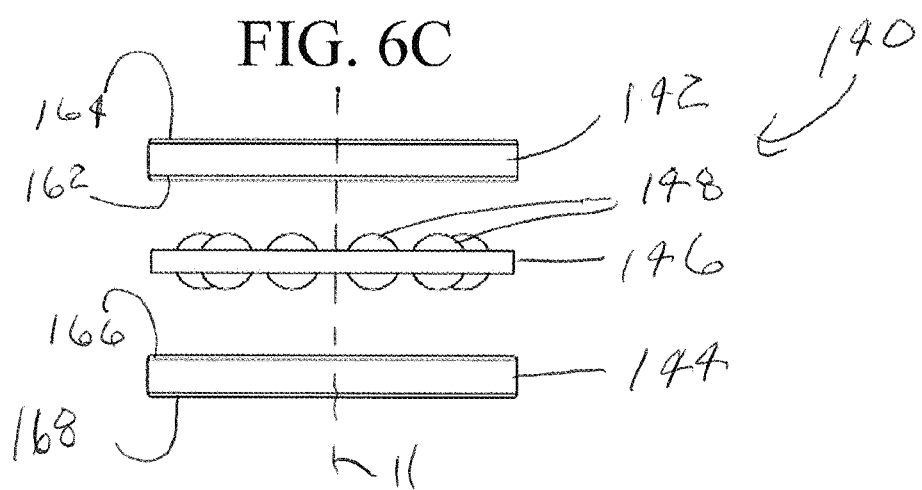

One embodiment of an exemplary thrust bearing structure 40 is shown by the thrust ball bearing structure 140 in FIGS. 6A-6C. FIGS. 6A-6C show a perspective view of the thrust ball bearing structure 140, a plan view of the thrust ball bearing structure 140, and an exploded side view of the thrust ball bearing structure 140, respectively, that may be used with a packaged device adapter apparatus 10 such as shown FIGS. 1-5. One will recognize that various other types of thrust bearing structures as described herein may be used in the packaged device adapter apparatus 10 and that the ball bearing structure 140 is only shown for illustration purposes, but it may have beneficial features over other bearing structures.

The thrust ball bearing structure 140 may be provided as a single assembled part or may be provided as multiple components. As shown in FIGS. 6A-6C, the thrust ball bearing structure 140 includes a first race ring 142 having an inner surface 162 comprising a first groove (not shown) to receive a plurality of ball bearings 148 and an outer planar surface 164 opposite the inner surface 162. Further, the thrust ball bearing structure 140 includes a second race ring 144 having an inner surface 166 including a second groove 152 to receive the plurality of ball bearings 148 and an outer planar surface 168 opposite the inner surface 166. Yet further, the thrust ball bearing structure 140 includes a bearing ring 146 supporting the plurality of ball bearings 148. The plurality of ball bearings 148 are held in the bearing ring 146 between the first race ring 142 and the second race ring 144 in the first groove (not shown) and the second groove 152.

At least in one embodiment, the outer planar surface 164 (e.g., which lies generally orthogonal to axis 11) of the first race 142 is positioned to receive a force applied from the contact surface 24 (e.g., which lies generally orthogonal to axis 11) of the torque applicator 20. The bearing structure 140 transfers the received force to the packaged device 15 via the outer planar surface 168 of the second race 144.

For example, in the case of using ball bearings, the bearing structure 140 includes races in which the set of balls are received. For example, each race may be a ring with a groove where the ball rests. The groove may be shaped so that the ball is slightly loose fit in the groove. Thus, in principle, the ball contacts each of the races in which the ball is held at a single point. The point contact of the rolling elements within the bearing structure provide for a reduced friction when applying a force using the torque applicator 20 to the packaged device 15. As the balls roll freely when turned, friction is reduced. For example, it is beneficial to use a bearing structure when applying relatively high torque, such as, for example, 40 in-lbs. Without the bearing structure, the torque applied is 40 in-lbs.; however, with use of the bearing structure, the torque may be 20 in-lbs. In other words, almost half of the torque may be attributed to friction.

The compression assembly 38 may include the use of bearing structure 40 alone or in combination with a compression plate apparatus 42 to transfer the force applied using the torque applicator 20 to the packaged device 15. For example, the bearing structure 40 may be in direct contact with the contact surface 24 of the torque applicator 20 and also with the upper surface 190 of the packaged device 15 to transfer the axial force in the direction of axis 11 with reduced friction. Further, for example, the bearing structure 40 may be indirectly in contact with the contact surface 24 of the torque applicator 20 (e.g., a plate may be used between the contact surface and the bearing structure) and also in direct contact with the upper surface 190 of the packaged device 15 to transfer the axial force in the direction of axis 11 with reduced friction.

However, at least in one or more embodiments, a compression plate apparatus 42 is used to transfer the force applied using the torque applicator 20 to the packaged device 15. For example, one or more portions of the compression plate apparatus 42 may be positioned between the bearing structure 40 and the packaged device 15 when the packaged device 15 is received in the socket cavity 103 such that an axial force applied using the torque applicator 20 is transferred through the bearing structure 40 and via one or portions of the compression plate apparatus 42 to the packaged device 15 when received in the socket cavity 103.

In one or more embodiments, the compression plate apparatus 42 may include one or more plate elements (e.g., 80, 82) forming a compression plate body having a first surface 182 configured to contact a packaged device 15 when received in the socket cavity 103 and a second surface 184 opposite the first surface 182. The compression plate apparatus 42 may either be a floating compression plate apparatus for transferring the force from the threaded portion 30 of the torque applicator 20 to the packaged device 15 via the bearing structure 40, or the compression plate apparatus 42 may be movably coupled to the socket lid 104 or any other component of the adaptor body 101.

In at least one embodiment, the compression plate apparatus 42 includes a first plate 80 coupled to a second plate 82 using one or more coupling elements 83 (e.g., threaded elements and openings). The second plate 82 may include the first surface 182 configured to contact a packaged device 15 when received in the socket cavity 103. The first surface 182 (e.g., a planar surface lying orthogonal to axis 11) of second plate 82 may be sized and/or configured to directly contact the entire upper surface 190 of the packaged device 15. Further for example, the first plate 80 may include the second surface 184. The second surface 184 (e.g., a planar surface generally lying orthogonal to axis 11) or any other part of the compression plate apparatus 42 does not directly contact the contact surface 24 of the torque applicator 20. Rather, the torque applicator 20 contacts (e.g., via contact surface 24) bearing structure 40 to reduce friction within the adapter apparatus 10.

In one or more embodiments, the compression assembly 38 includes at least the second surface 184 of the compression plate apparatus 42 opposite one or more other surfaces (e.g., such as first surface 182) which may be provided in contact with packaged device 15. In at least one embodiment, to provide the compression assembly 38, a cavity 47 is defined in or into the second surface 184 to receive the bearing structure 40. The cavity 47 is configured such that one or more surfaces (e.g., contact surface 24) of the torque applicator 20 contact the bearing structure 40 received in the cavity 47 without contacting one or more other surfaces or portions of the compression assembly 38.

For example, at least in one embodiment, the cavity 47 defined along axis 11 has a depth 49 extending into the second surface 184 such that a contact surface of the bearing structure 40 (e.g., upper or outside surface of race 201) extends beyond the second surface 184 such that a force applied by the torque applicator 20 (e.g., via applicator contact surface 24) to the compression assembly 38 is applied to the contact surface of the bearing structure 40 (e.g., upper or outside surface of race 201) instead of the second surface 184 of the compression plate apparatus 42. For example, assuming the bearing structure 40 is the bearing structure 140 shown in FIGS. 6A-6C, the height 51 (shown in FIG. 3) of the bearing structure 140 is greater than the depth 49 extending into the second surface 184 such that a force applied via contact surface 24 of torque applicator 20 to the compression assembly 38 is applied to the outer planar surface 164 of the first race ring 142 of bearing structure 140 instead of being applied to the second surface 184 of the compression plate apparatus 42.

One will recognize that any configuration for the bearing structure 40 and cavity 47 defined to receive the bearing structure 40 may suitably be used as long as the torque applicator 20 applies the force along axis 11 to bearing structure 40 (e.g., either directly or indirectly) and not directly to compression plate apparatus 42 (e.g., which may be in contact with packaged device 15). Further, for example, in one or more embodiments, the size of the cavity 47 may be used to restrict move of the bearing structure 40 in the cavity 47 (e.g., the diameter of the cavity 47 may be similar to the diameter of the first and second race rings 142, 144 to keep the center of the bearing structure positioned on the axis 11).

Further, for example, when using an adaptor apparatus 10 that includes a bearing structure 40 according to one or more embodiments of the present disclosure, a packaged device 15 may be positioned in socket cavity 103 of the adaptor body 101 such that the plurality of contact elements 16 of the packaged device 15 are at least aligned with arranged conductive elements (e.g., 18) corresponding thereto. The threaded portion 30 of the torque applicator 20 is inserted into the threaded opening 105 of the adaptor body 101. The threaded portion 30 of the torque applicator 20 may be turned using, for example, the handle 27 for use in applying a force on the packaged device 15 positioned in the socket cavity 103 such that the plurality of contact elements 16 of the packaged device 15 are in electrical contact with the arranged conductive elements corresponding thereto. The threaded portion 30 may be turned into the threaded opening 105 of the adaptor body 101 until a desired force on the packaged device 15 has been reached. FIG. 3 shows the adapter apparatus 10 in a configuration where a force is not being applied to the packaged device 15 as is apparent from the gap 63 between the upper surface 190 of the packaged device 15 and the compression plate apparatus 42 of the compression assembly 38.

In operation, with the packaged device 15 received within the socket cavity 103 and the lid 104 being coupled to the socket base 102 (e.g., latched), turning of the torque applicator 20 applies a torque and force (e.g., at least an axial force) to the bearing structure 40 (e.g., a force applied to the outer planar surface 164 of the first race ring 142 of thrust bearing structure 140 by the contact surface 24 of the torque applicator 20) which in turn transfers the force (e.g., at least an axial force) to the packaged device 15 via the compression plate apparatus 42 (e.g., if a compression plate apparatus is used as part of the compression assembly 38).

Figure 7A:
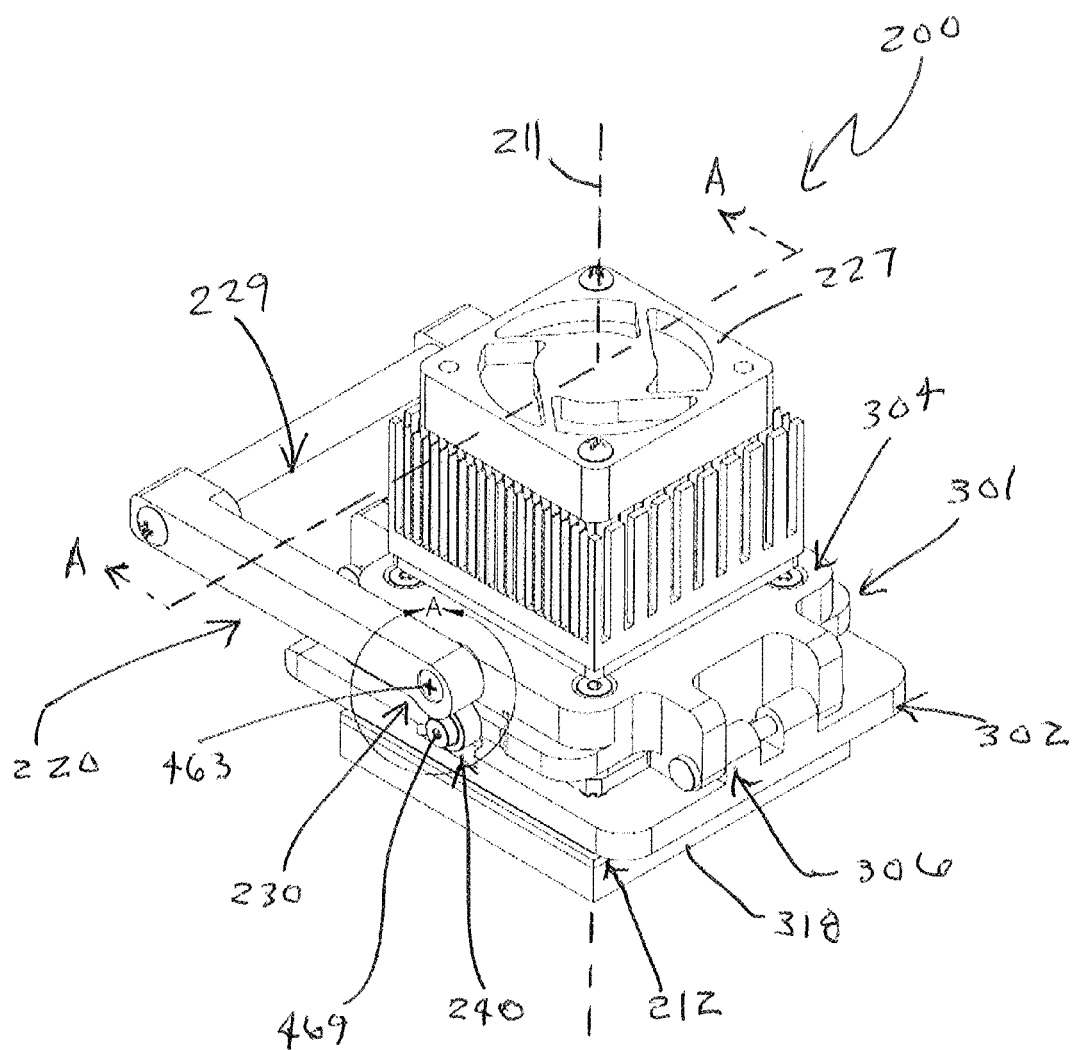
FIG. 7A is a perspective view of an exemplary packaged device adapter apparatus showing another exemplary torque applicator, the apparatus being mounted relative to a target board.
Figure 7B:
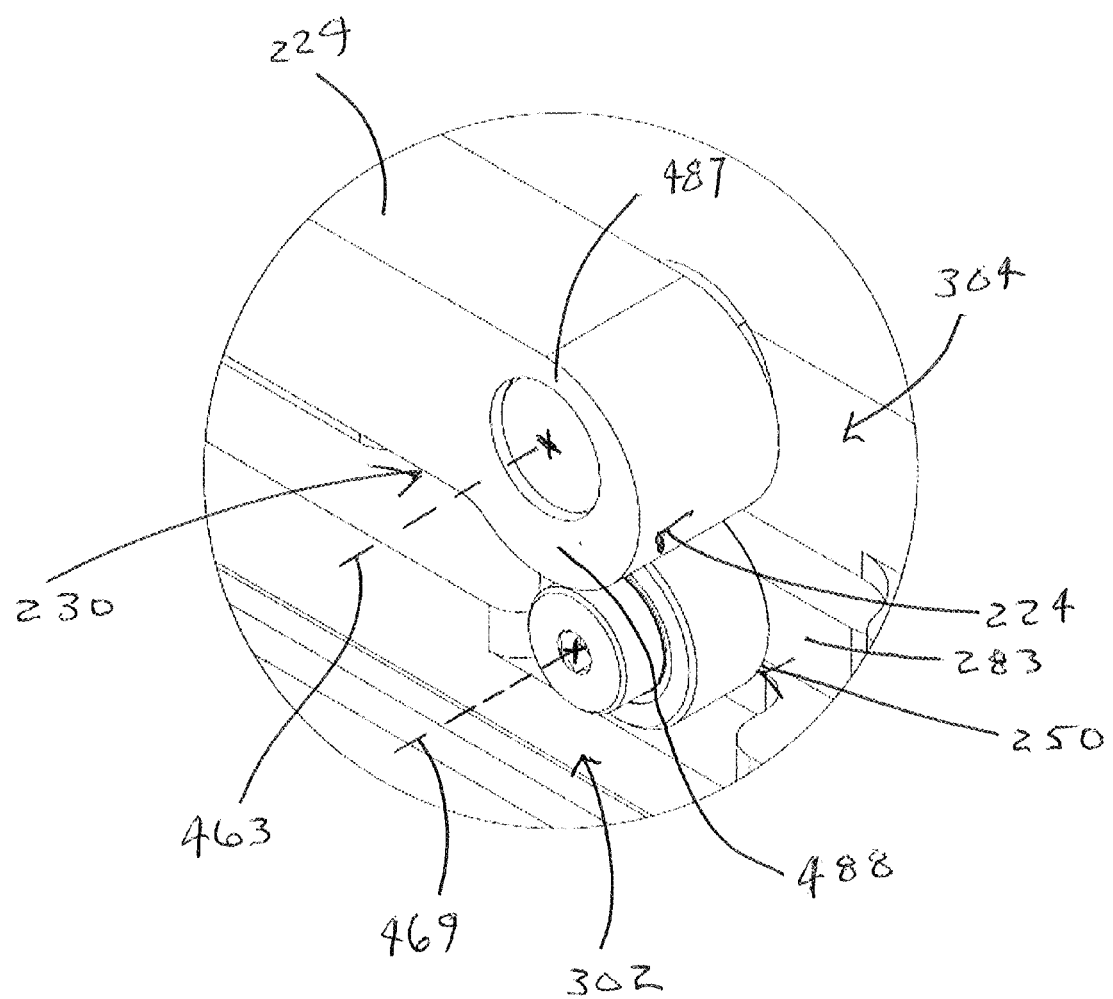
FIG. 7B is a more detailed perspective view of a region of the torque applicator of FIG. 7A including a cam portion.
Figure 8:
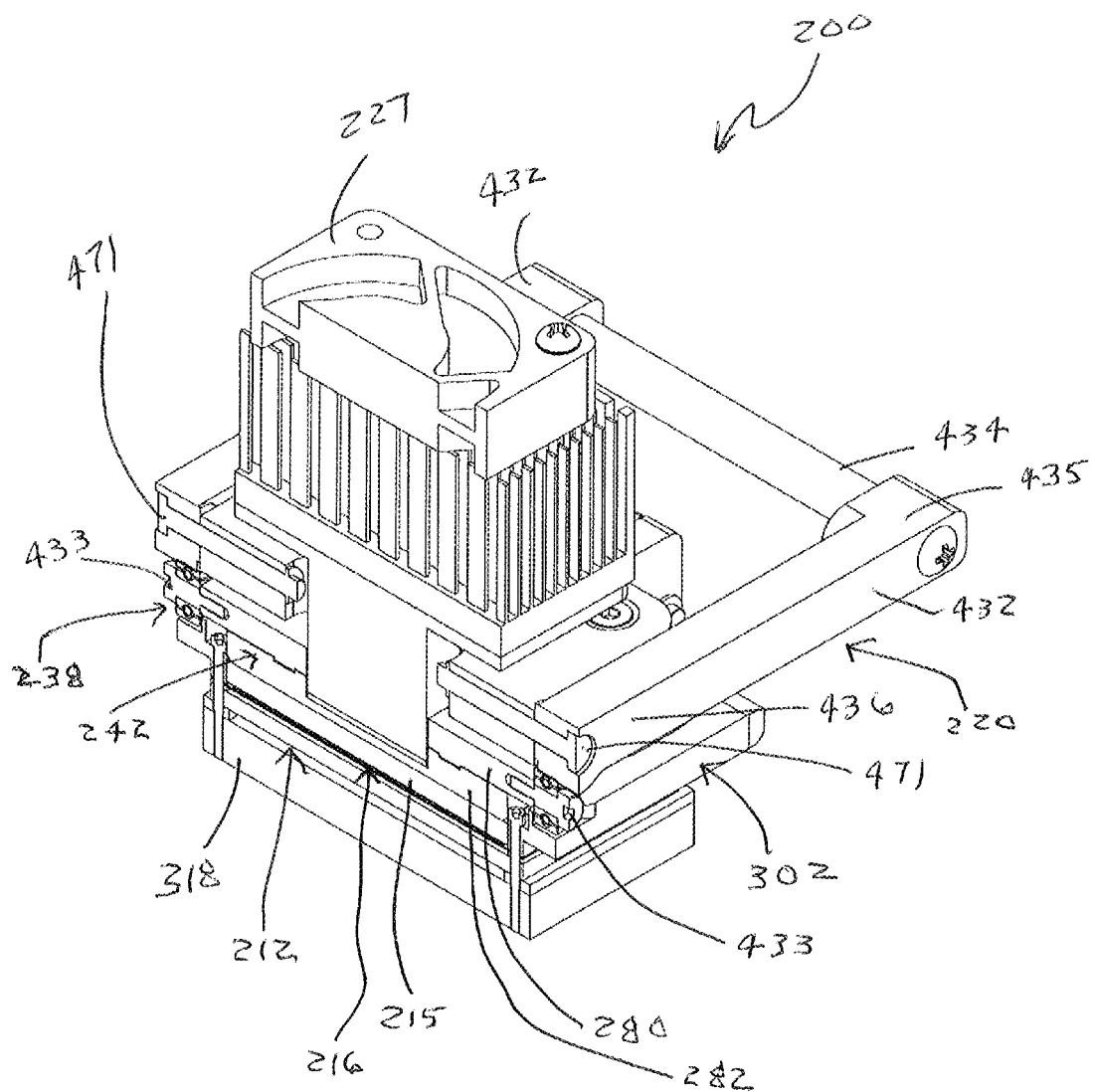
FIG. 8 is a perspective cross-section view of the exemplary packaged device adapter apparatus of FIG. 7A taken along line A-A of FIG. 7A.
Figure 9:
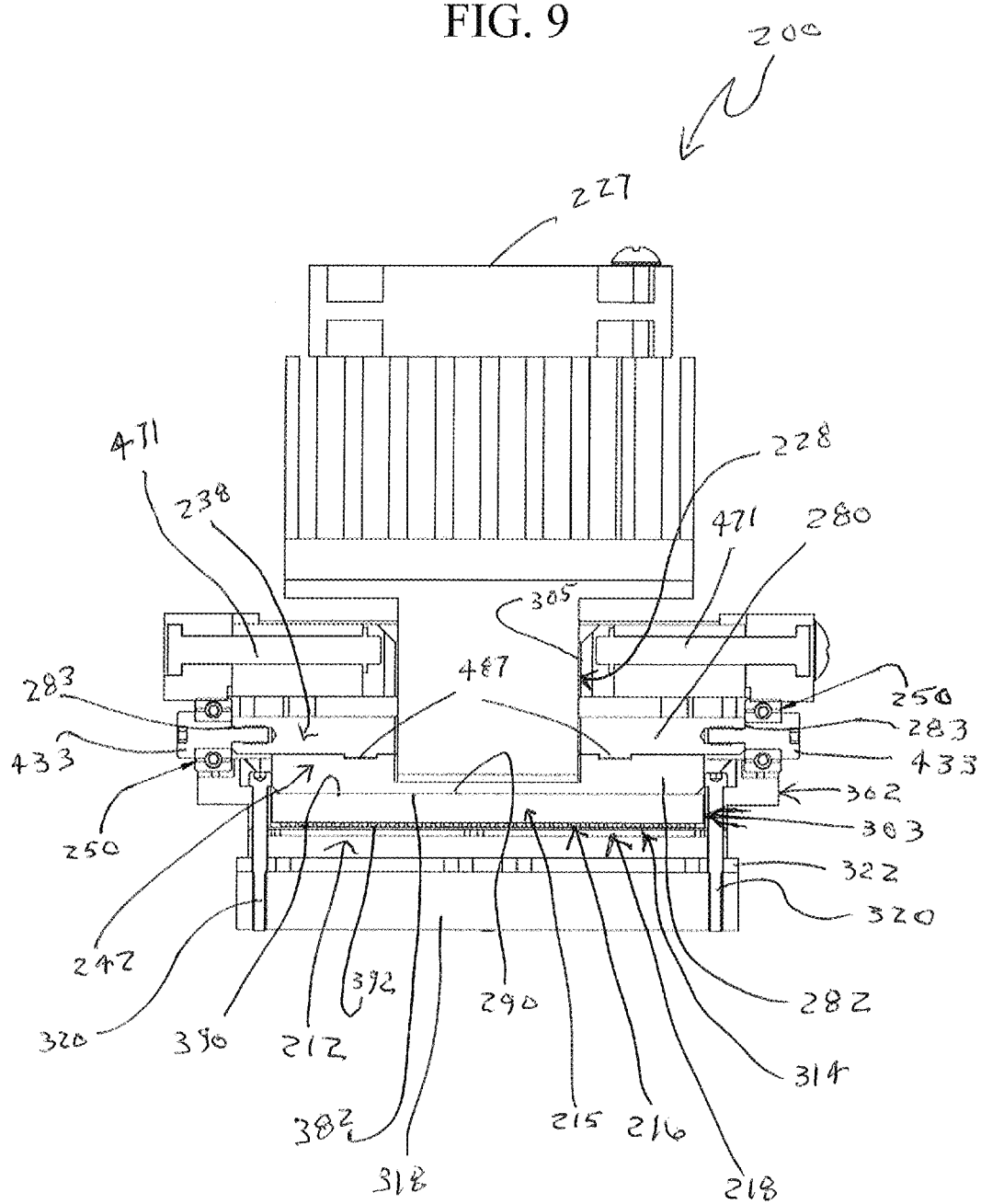
FIG. 9 is a side cross-section view of the exemplary packaged device adapter apparatus of FIG. 7A taken along line A-A of FIG. 7A.
Figure 10A:
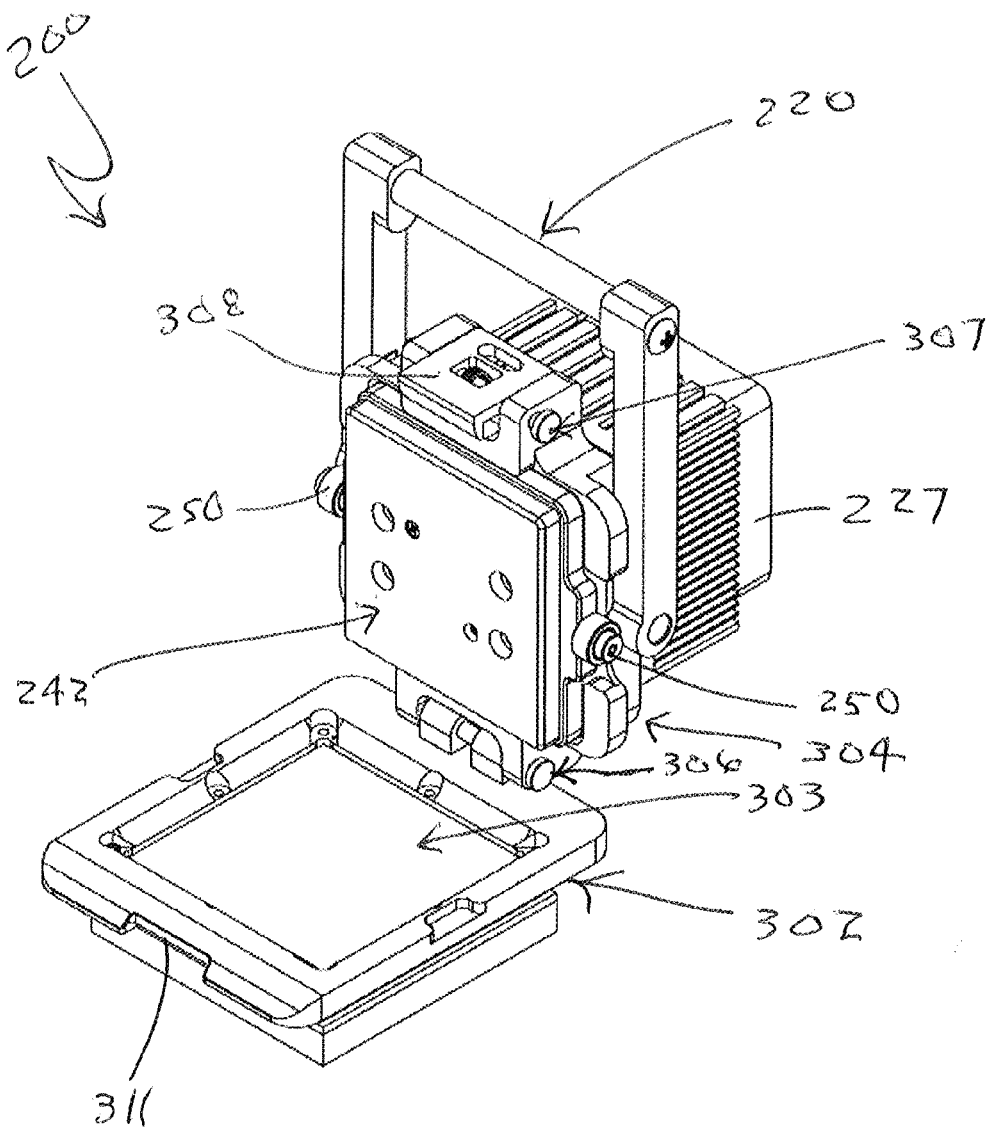
FIG. 10A is a perspective view of a portion of the exemplary packaged device adapter apparatus shown in FIGS. 7-9 with the lid of the adapter body being in an open position.
Figure 10B:
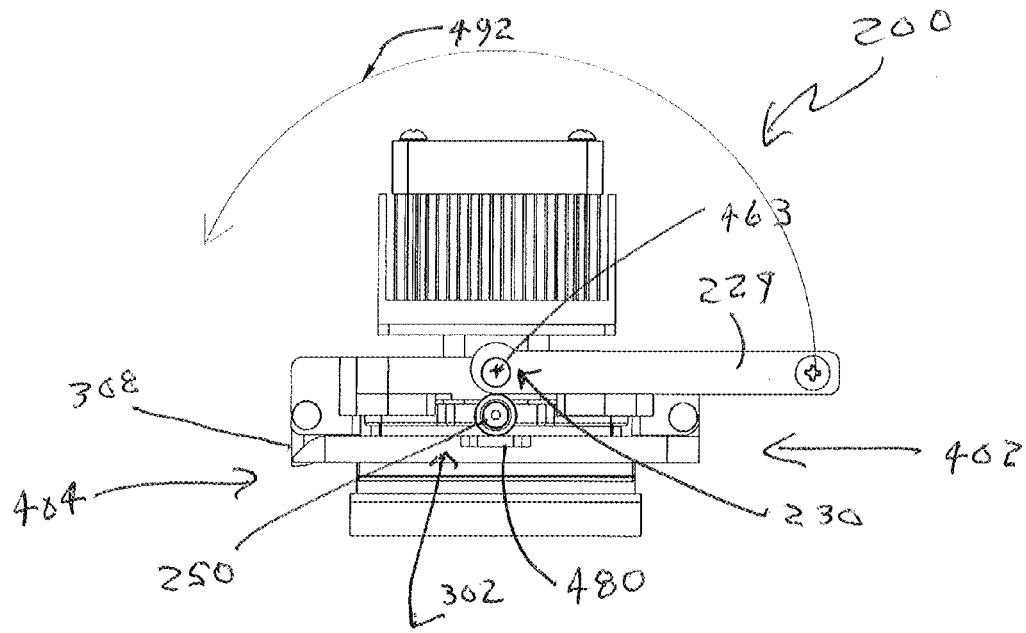
FIG. 10B is a side view of the exemplary packaged device adapter apparatus shown in FIGS. 7-9 with the lid of the adapter body being in a closed position and without a force being applied by a lever portion of the torque applicator.
Figure 10C:
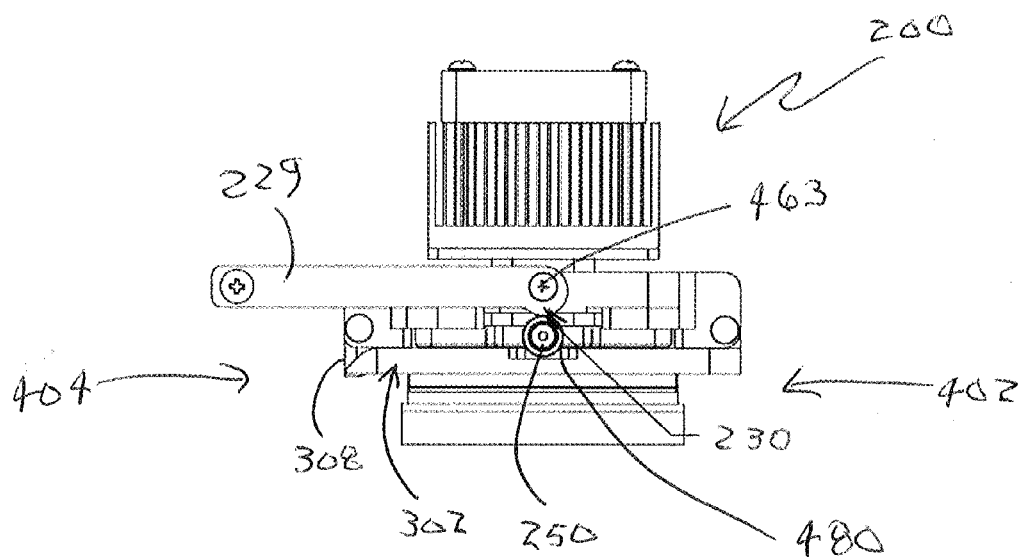
FIG. 10C is a side view of the exemplary packaged device adapter apparatus shown in FIGS. 7-9 with the lid of the adapter body being in a closed position and with a force being applied by a lever portion of the torque applicator.
Figure 11:
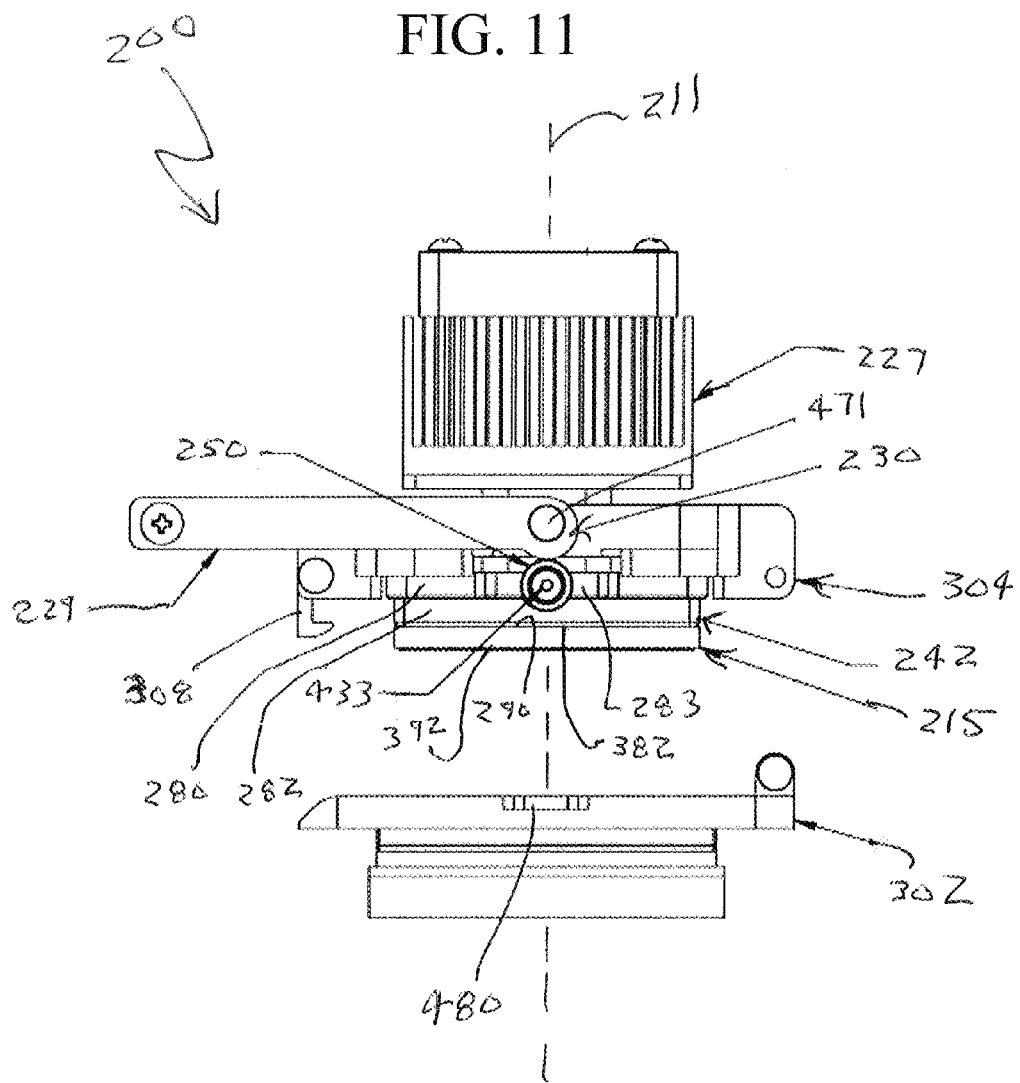
FIG. 11 is an exploded side view of the packaged device adapter apparatus shown in FIGS. 7-10.
Figure 12A:
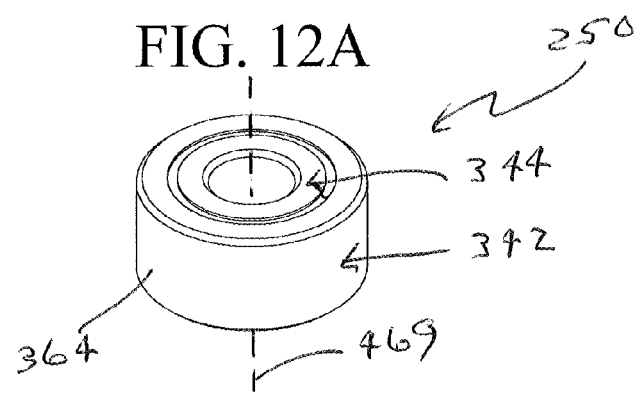
FIGS. 12A-12D are a perspective view, a plan view, a side view, and a cross section view taken along line D-D of FIG. 12C, respectively, of one exemplary embodiment of a bearing structure that may be used in a packaged device adapter apparatus such as shown FIGS. 7-11.
Figure 12B:
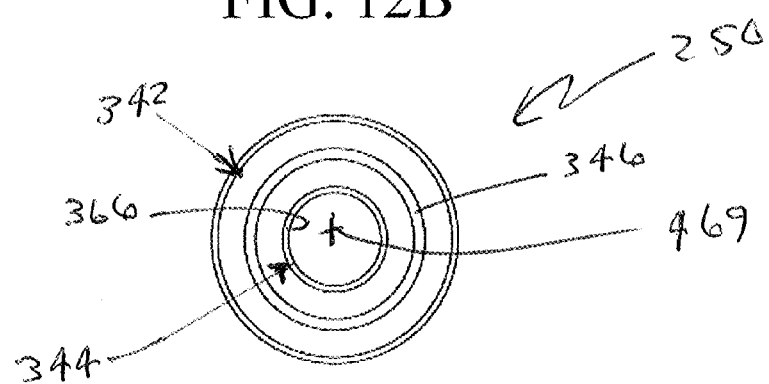
Figure 12C:
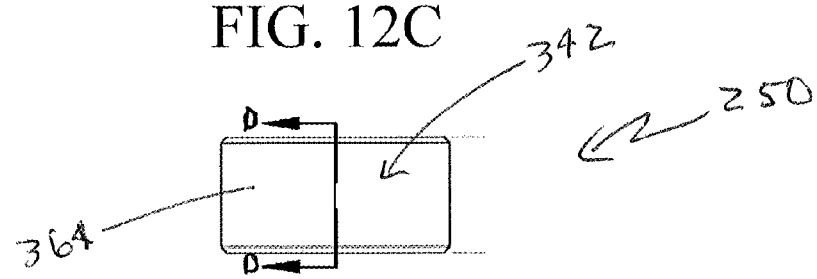
Figure 12D:
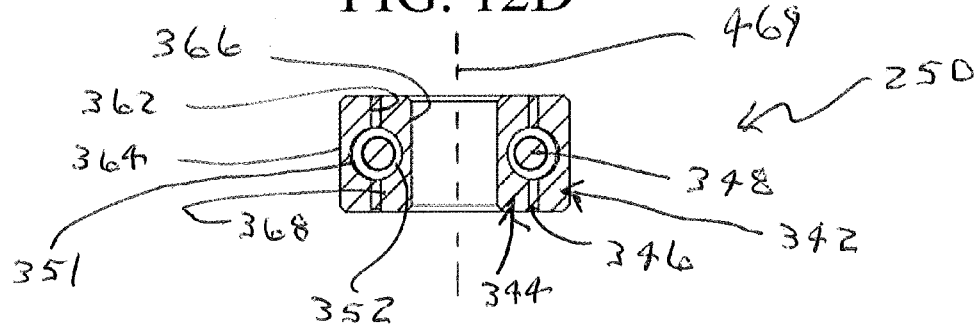

FIG. 7A is a perspective view of the exemplary packaged device adaptor apparatus 200 including a hinged torque applicator 220 and a bearing structure 240 for use in applying a force to a packaged device when received in the adapter apparatus 200. FIG. 7B is a more detailed perspective view of a region A of the hinged torque applicator 220 of FIG. 7A including a cam portion 230 and a bearing 250 (e.g., one of a pair of bearings 250). The exemplary packaged device adaptor apparatus 200 is mounted relative to a target board 212. A perspective cross-section view of the exemplary packaged device adapter apparatus 200 taken along line A-A of FIG. 7A is shown in FIG. 8. A side cross-section view of the exemplary packaged device adapter apparatus 200 taken along line A-A of FIG. 7A is shown in FIG. 9. A perspective view of the exemplary packaged device adapter apparatus 200 (e.g., an adapter body 301 configured with a hinged torque applicator 220; with a lid 304 of the adapter body 301 being in an open position) is shown in FIG. 10A, FIG. 10B is a side view of the exemplary packaged device adapter apparatus 200 shown in FIGS. 7-9 with the lid 304 of the adapter body 301 being in a closed and latched position and without a force being applied using a lever portion 229 of the hinged torque applicator 220, and FIG. 10C is a side view of the exemplary packaged device adapter apparatus 200 shown in FIGS. 7-9 with the lid 304 of the adapter body 301 being in a closed and latched position and with a force being applied using a lever portion 229 of the torque applicator 220. Still further, an exploded side view of the packaged device adapter apparatus 200 is shown in FIG. 11.

The adaptor apparatus 200 is for use with a packaged device 215 (see FIGS. 8-9) having a plurality of contact elements 216 disposed on a surface (e.g., bottom surface 392) thereof. The adaptor apparatus 200 includes adaptor body 301 defining a socket cavity 303 (see FIGS. 9 and 10A) configured to receive the packaged device 215 such that the plurality of contact elements 216 of the packaged device 215 are at least aligned with arranged conductive elements (e.g., arranged contacts 218). For example, the conductive elements may include conductive elements which form a portion of adaptor apparatus 200. However, the conductive elements may include other elements in one or more other applications as will be apparent from the description herein, such as, for example, an arranged pattern of contacts 218 on a surface of a target board 212 (see FIG. 9).

The adaptor body 301 further includes a threaded opening 305. A heat sink 227 includes a threaded portion 228 configured to mate with the threaded opening 305 of the adaptor body 301. Any heat sink apparatus may be used for removing heat from the adapter apparatus 200.

The hinged torque applicator 220 is provided for use in applying a force upon the packaged device 215 received in the socket cavity 303 defined by the adaptor body 301. In one embodiment, the hinged torque applicator 220 is coupled to the adapter body 301 for use in applying an axial force. For example, the hinged torque applicator 220 may include movable lever portion 229 terminating in a pair of cam portions 230 on opposing sides of the adapter body 301 that provide contact surfaces 224. Further, in one or more embodiments, a compression assembly 238 including a bearing structure 240 (e.g., a pair of bearings 250 with each bearing structure of the pair positioned between a contact surface 224 of a cam portion 230 and a packaged device 215 when received in the socket cavity 303) may be used to transfer a force (e.g., an axial force) applied using the hinged torque applicator 220 to the packaged device 215.

Various components of the adaptor apparatus 200 may lie along axis 211, including portions of the compression assembly 238. In one or more embodiments, the hinged torque applicator 220 is a lever actuatable apparatus. For example, moving of the lever portion 229 of the hinged torque applicator 220 about a lever hinge point 463 from a first side of the adapter apparatus 200 (e.g., rear side 402) to a second side of the adapter apparatus 200 (e.g., front side 404), as shown in FIGS. 10B and 10C, asserts a force indirectly onto packaged device 215. For example, a force (e.g., an axial force in the direction of axis 211) may be used to provide the contact elements 216 of the packaged device 215 such that they are in electrical contact with an arrangement of conductive elements (e.g., conductive pin elements, an arranged pattern of contacts 218 on a surface of a target board 212 (see FIG. 9), etc.) corresponding thereto, when a certain torque or force has been applied by the hinged torque applicator 220.

For example, in one or more embodiments (see, e.g., FIG. 8), the lever portion 229 of the hinged torque applicator 220 includes first and second handle elements 432 (e.g., each extending from a first end 435 to a second end 436). The first ends 435 of the first and second handle elements 432 are separated by a third handle element 434. The second ends 436 of the first and second handle elements 432 include and/or terminate at cam portions 230. Each of the cam portions 230 are used with a bearing 250 of compression assembly 238 to apply at least an axial force in the direction of axis 211 (e.g., although certain non-axial forces may be present) on the packaged device 215. At least an axial force applied using the torque applicator 220 is transferred via the pair of bearings 250 as described herein. The axis 211 is generally orthogonal, at least in one embodiment, to the target board 212.

The hinged torque applicator 220 and compression assembly 238 according to one embodiment provides an adaptor apparatus 200 with the ability to provide a certain force to be applied to a packaged device 215 when mounted within the adaptor body 301. With use of the pair of bearings 250, metal grindings on the lever hinge point 463 are reduced when the lever portion 229 of the hinged torque applicator 220 is actuated (e.g., moved from an open non-force applying position to a closed force applying position). Further, for example, such pair of bearings 250 reduce the wear on adapter apparatus components due to friction. For example, the pair of bearings 250 assist in minimizing the friction near the lever hinge point 463, and also reduce the force needed to actuate the lever portion from an open non-force applying position to a closed force applying position.

The packaged device 215 may be any packaged device having a plurality of contact elements 216 disposed on a surface thereof, such as described with reference to the packaged device 15 of FIGS. 1-7. Although one packaged device 215 is shown in the figures, the present disclosure is in no manner limited to the use of the illustrative adaptor apparatus embodiments described herein with packages that are configured in such a manner. Rather, adaptor apparatus described herein may be used with any packaged device having contact elements disposed on a surface thereof.

In one embodiment, as shown in FIGS. 8-9, packaged device 215 includes an upper surface 390 and a lower surface 392, in addition to one or more side surfaces extending therebetween at the perimeter of the packaged device 215. The plurality of contact elements 216 are disposed at least at the lower surface 392. For example, the contact elements 216 may be distributed in an array along orthogonal X and Y axes, or the contact elements (e.g., lands) may be distributed along the outer portions of the lower surface 392 proximate the perimeter thereof. However, any arrangement of contact elements 216 may be accommodated according to the present disclosure.

The adaptor body 301 may be provided by any number of components that define the socket cavity 303 configured to receive the packaged device 215 therein. At least in one or more embodiments, the packaged device 215 is received within the socket cavity 303 such that the plurality of contact elements 216 of the packaged device 215 are at least aligned with arranged conductive elements corresponding thereto (e.g., pads of a target board, conductive elastomer elements, etc.). Apart from being operable to receive the packaged device 215, the configuration of the adaptor body 301 may take any number of forms. For example, the adaptor body may include elements such as those found in U.S. Pat. No. 7,565,843, U.S. Pat. No. 6,533,589, U.S. Pat. No. 6,394,820, U.S. Pat. No. 5,791,914, U.S. Pat. No. 4,460,223, U.S. Pat. No. 5,892,245, and/or U.S. Pat. No. 5,730,620. For example, such adaptor bodies may be configured for receiving a packaged device 215 to be located or aligned with contact pads on a target board, may be configured for receiving a packaged device such that the contact elements 216 thereof are positioned adjacent a conductive elastomer, or may include, for example, a clamshell socket body as shown and described generally herein. Although the hinged torque applicator 220 and/or pair of bearings 250 are described herein particularly with reference to use with a clamshell socket defining a socket cavity 303, torque applicators and/or bearing structures as described herein may be used with any other adaptor apparatus.

As shown in FIGS. 8-11, the adaptor body 301 (e.g., a clamshell socket) includes socket base 302 defining the socket cavity 303 therein configured to receive a packaged device 215. The adaptor body 301 further includes socket lid 304 used to close the socket cavity 303 that is hinged to the socket base 302 using a hinge pin or pins 306. The socket lid 304 includes the threaded opening 305 for mating with a threaded portion 228 of the heat sink 227.

Further, as shown in FIGS. 8-11, the adaptor body 301 may include a latch mechanism for latching the lid 304 to the socket base 302. In one embodiment, the latch mechanism includes a latch element 308 connected to the socket lid 304 using a latch spring and hinge pin apparatus 307. The latch element 308 engages the socket base 302 at indent 311 achieving a closed and latched state.

The exemplary adaptor shown in FIGS. 8-11 further includes various components. For example, the adaptor apparatus 200 may include a guide layer 314 provided to guide the packaged device 215 and align the packaged device 215 to the arranged conductive elements 218. Further, for example, an insulation plate 322, a backing plate 318, and socket base screws 320 may be provided for mounting the adaptor body 301 relative to the target board 212 (e.g., a printed circuit board).

As previously described herein, the components forming the adaptor body 301 may take one of various different forms, such as described with respect to the adapter body 201 described with reference to FIGS. 1-5, and any particular listing and/or provision of description herein with respect to a particular adaptor body is not to be construed as limiting to the present disclosure. Further, for example, the arrangement of conductive elements to which the contact elements 216 of the packaged device are aligned and provided in electrical contact, may take one of various different types or forms. For example, the arrangement of conductive elements may be provided by a conductive elastomer layer, a pin arrangement structure, a socket arrangement structure, or any other arrangement of conductive elements as would be known to one skilled in the art.

FIGS. 7-11 show the exemplary hinged torque applicator 220 that may be used in the packaged device adapter apparatus 200. The hinged torque applicator 220 is configured to apply a force (e.g., indirectly through bearing structure 240, such as the pair of bearings 250) upon the packaged device 215 received in the socket cavity 303 of the adapter body 301 and includes the lever portion 229 which terminates in the pair of cam portions 230 on opposing sides of the adapter body 301 (e.g., sides opposite the clam socket hinge 306 and latch 308). Each of the pair of cam portions 230 includes a contact surface 224. Contact surface 224 is configured to provide contact with one or more further components (e.g., a bearing 250 of compression assembly 238) such that torque (e.g., an axial force) applied using the hinged torque applicator 220 may be transferred to the packaged device 215 when the lever portion 229 is moved from an open non-force applying position to a closed force applying position as shown in FIGS. 10B and 10C.

For example, as shown in both FIGS. 10B and 10C, the adapter apparatus includes the latch element 308 engaged with the socket base 302 at indent 311 achieving a closed and latched state of the clam shell socket. FIG. 10B shows the adapter apparatus 200 with a lever portion 229 in an open non-force applying position. In other words, a force is not being applied to the packaged device 215 using the hinged torque applicator 220.

As shown in FIGS. 8-11 (particularly in detail in FIG. 7B), each cam portion 230 of the hinged torque applicator 220 includes a radial contact surface 224 about axis 463 that varies in distance from hinge point axis 463. The hinged torque applicator 220 is mounted or rotatably coupled to the sides of the socket lid 304 by mounting hardware 471. The hinged torque applicator 220 is rotatably coupled such that the lever portion 229 is rotatable about the hinge point axis 463. When the lever portion 229 is in an open non-force applying position, a portion 487 of the contact surface 224 of each cam portion 230 which is of a relatively lesser distance from hinge point axis 463 (e.g., relative to other portions of the contact surface 224) is adjacent and in contact with a respective bearing 250 also located at the side of the socket lid 304. In such an open non-force applying position, a gap exists between the bearing structure 250 and a lower surface of a recess 480 formed in the socket base 302 (e.g., the recess allowing the bearing structure 250 to move downward and into the recess when the lever portion 229 is in the closed force applying position).

When the lever portion 229 is rotated from the rear side 402 of the adapter apparatus 200 to the front side 404 about hinge point axis 463 and into the closed force applying position, a portion 488 of the contact surface 224 of each cam portion 230 which is of a relatively greater distance from hinge point axis 463 (e.g., relative to other portions of the contact surface 224) is adjacent and in contact with the respective bearing 250 located at the side of the socket lid 304. In such a closed force applying position, the cam contact surfaces 488 of the pair of cam portions 230 force the respective bearings 250 downward into the recesses 480 formed in the socket base 302 (e.g., in view of the hinge point axis 463 being fixed relative to the socket lid 304 and the thickness of the cam portion 230 between the hinge point axis 463 and the bearings 250 increasing as the lever portion 229 is rotated).

At least in one embodiment, the contact surface 224 is a curved surface. However, one or more various configurations of such a contact surface which terminates the lever portion 229 are contemplated herein depending upon the configuration of the bearing structure. Any contact surface configuration where the terminating surface suitably contacts a surface of the bearing 250 used for transfer of force to the packaged device 215 may be used.

The contact surfaces 224 of the cam portions 230 interface indirectly with a packaged device 215 received in the socket cavity 303 through bearing structure 240 (e.g., the pair of bearings 250). For example, the contact surfaces 224 may interface indirectly with the packaged device 215 through use of compression assembly 238 including, for example, the pair of bearings 250 and a compression plate apparatus 242.

Force applied using the torque applicator 220 is transferred to the packaged device 215 with use of the compression assembly 238. The compression assembly 238 includes at least the pair of bearings 250 (e.g., the pair of vertical bearings referred to as bearing structure 240 in FIG. 7A) positioned at the sides of the adapter apparatus 200 adjacent the contact surfaces 224 of the pair of cam portions 230 of the hinged torque applicator 220 (e.g., to transfer an axial force applied using the torque applicator 220 to the packaged device 215). The pair of bearings 250 are connected to a compression plate apparatus 242 of the compression assembly (e.g., a spring loaded compression plate assembly) which applies the axial force to the packaged device 215 when received in the socket cavity 303.

For example, the pair of bearings 250 include a pair of vertical bearings, with each vertical bearing defined about an axis 469 thereof which lies orthogonal to the axis 211 of the adapter apparatus 200. Further, for example, the axis 469 about which the pair of vertical bearings 250 are defined may be parallel to axis 463 about which the hinged torque applicator 220 rotates.

Each of the bearings 250 may include any bearing apparatus configured to transfer an axial force to the packaged device 215. At least in one embodiment, the bearings 250 may include a thrust bearing structure to transfer the force applied using the torque applicator 220 to the packaged device 215. For example, such thrust bearing structures may include thrust ball bearings (e.g., including a plurality of ball bearings supported in a ring); cylindrical thrust roller bearings (e.g., including a plurality of cylindrical rollers arranged flat with their axis pointing orthogonal to the axis 211); tapered roller thrust bearings (e.g., including a plurality of small tapered rollers arranged so that their axes all converge at a point on axis 469); spherical roller thrust bearings (e.g., including a plurality of asymmetrical rollers of spherical shape rolling inside a housing washer with a raceway with spherical inner shape); fluid bearings, magnetic bearings, or any other suitable bearing structure providing the ability to transfer a force applied using the torque applicator 220 to the packaged device 215.

The bearings 250 may include a plurality of rolling elements in a rolling element bearing structure, wherein the rolling elements ride on races. For example, the bearing 250 may include a circular outer race (e.g., 342) radially about axis 469 including an inner surface and an outer surface opposite the inner surface, a circular inner race (e.g., 344) including an inner surface adjacent axis 469 extending therethrough and an outer surface opposite the inner surface, and a plurality of bearing elements (e.g., ball bearings supported in a ring 346) positioned between the inner surface of the circular outer race (e.g., 342) and the outer surface of the circular inner race (e.g., 344). The outer surface of the circular outer race (e.g., 342) may be positioned to receive a force applied from the torque applicator 220 (e.g., via the contact surface 224 of a cam portion 230). The bearing 250 may be configured to suitably transfer the force applied from the torque applicator 220 to the packaged device 215 (e.g., via connection to the compression plate apparatus 242 as described herein).

One embodiment of an exemplary thrust bearing 250 is shown by the ball bearing structure in FIGS. 12A-12D. FIGS. 12A-12D show a perspective view of the ball bearing structure 250, a plan view of the ball bearing structure 250, a side view of the ball bearing structure, and a cross-section view of the ball bearing structure 250 taken along line D-D of FIG. 12C, respectively, that may be used with a packaged device adapter apparatus 200 such as shown in FIGS. 8-11. One will recognize that various other types of bearings as described herein may be used in the packaged device adapter apparatus 200 and that the ball bearing 250 is only shown for illustration purposes, but it may have beneficial features over other bearings.

The ball bearing 250 may be provided as a single assembled part or may be provided as multiple components. As shown in FIGS. 12A-12D, the ball bearing 250 includes a circular outer race ring 342 having an inner surface 362 comprising a first groove 351 to receive a plurality of ball bearings 348 and an outer circular surface 364 opposite the inner surface 362. Further, the ball bearing structure 250 includes a circular inner race ring 344 having an outer surface 368 including a second groove 352 to receive the plurality of ball bearings 348 and an inner surface 366 opposite the outer surface 368 and adjacent axis 469. Yet further, the ball bearing structure 250 includes a bearing ring 346 supporting the plurality of ball bearings 348. The plurality of ball bearings 348 are held in the bearing ring 346 between the circular outer race ring 342 and the circular inner race ring 344 in the first groove 351 and the second groove 352 (e.g., the circular race rings and circular bearing ring are concentric with axis 469).

At least in one embodiment, the outer circular surface 364 (e.g., which lies along axis 469 which is generally orthogonal to axis 211) of the circular outer race 342 is positioned to receive a force applied in the same direction as axis 211 of the adapter apparatus from the contact surface 224 of the hinged torque applicator 220. The bearing structure 250 transfers the received force to the packaged device 215 via the inner circular surface 366 of the circular inner race 344 connected to the compression plate apparatus 242.

The compression assembly 238 includes the use of the pair of bearings 250 in combination with compression plate apparatus 242 to transfer the force applied using the torque applicator 220 to the packaged device 215. For example, the pair of bearings 250 may be coupled to one or more plate elements (e.g., 280, 282) at the sides of the adapter body 301. In one or more embodiments, hardware fasteners (e.g., screws 433) are inserted through an opening along axis 469 of the circular inner race 344 and attached to the one or more plate elements (e.g., 280, 282). The coupling of the pair of bearings 250 to the one or more plate elements (e.g., 280, 282) allows for the axial movement of bearings 250 along axis 211 to be transferred to the one or more plate elements (e.g., 280, 282). For example, the movement of the one or more plate elements (e.g., 280, 282) follows the axial movement of the pair of bearings 250 when a force is applied thereto by the contact surfaces 224 of the pair of cam portions 230 as the lever portion 229 of the hinged torque applicator 220 is rotated about axis 463 from an open non-force applying position to a closed force applying position. In other words, the one or more plate elements (e.g., 280, 282) move in the direction along axis 211. The one or more plate elements (e.g., 280, 282) are constructed of sufficiently rigid material (e.g., stainless steel) such that the axial force applied to the bearings 250 (and which moves the bearings 250 axially) is transferred effectively to the packaged device 215 by the one or more plate elements (e.g., 280, 282).

At least in one or more embodiments, compression plate apparatus 242 used to transfer the force applied using the torque applicator 220 to the packaged device 215 may include one or more plate elements (e.g., 280, 282) forming a compression plate body having a first surface 382 configured to contact a packaged device 215 when received in the socket cavity 303 and a second surface 384 opposite the first surface 382. One or more side surfaces 283 are located along the edges between the first surface 382 and second surface 384. For example, the one or more side surfaces 283 of the plate elements (e.g., 280, 282) may include at least two side surfaces into which screws 433 may be fastened to couple the pair of bearings 250 to the compression plate apparatus 242. The compression plate apparatus 242 may either be a floating compression plate apparatus for transferring the force from the torque applicator 220 to the packaged device 215 via the bearings 250, or the compression plate apparatus 242 may be movably coupled to the socket lid 304 or any other component of the adaptor body 301.

In at least one embodiment, the compression plate apparatus 242 includes a spring-loaded compression plate assembly including a first plate 280 coupled to a second plate 282 using one or more spring coupling elements 487 and/or other fastening elements. The second plate 282 may include the first surface 382 configured to contact a packaged device 215 when received in the socket cavity 303. The first surface 382 (e.g., a planar surface lying orthogonal to axis 211) of second plate 282 may be sized and/or configured to directly contact the entire or substantially the entire upper surface 290 of the packaged device 215. Further, for example, the first plate 280 may include the one or more side surfaces 383 into which screws 433 may be fastened for coupling the pair of bearings 250 to the compression plate apparatus 242. The surfaces or any other part of the compression plate apparatus 242 does not directly contact the contact surfaces 224 of pair of cam portions 230 of the hinged torque applicator 220. Rather, the torque applicator 220 contacts (e.g., via contact surfaces 224) the pair of bearings 250 to reduce friction within the adapter apparatus 200 which are used to transfer the force to the packaged device via the compression plate apparatus 242.

Further, for example, when using an adaptor apparatus 200 that includes a pair of bearings 250 according to one or more embodiments of the present disclosure, a packaged device 215 may be positioned in socket cavity 303 of the adaptor body 301 such that the plurality of contact elements 216 of the packaged device 215 are at least aligned with arranged conductive elements (e.g., 218) corresponding thereto. The movable lever portion 229 of the hinged torque applicator 220 may be moved (e.g., rotated about axis 463) to apply an axial force by each of the pair of cam portions 230 (e.g., via the contact surfaces 224 thereof) to a respective bearing of the pair of bearings 250 such that the plurality of contact elements 216 of the packaged device 215 are in electrical contact with the arranged conductive elements corresponding thereto. The hinged torque applicator 220 is configured such that when the lever portion 229 is in the closed force applying position a desired force on the packaged device 215 is reached.

In operation, with the packaged device 215 received within the socket cavity 303 and the lid 304 being coupled to the socket base 302 (e.g., latched), rotation of the movable lever portion 229 applies a torque and force (e.g., at least an axial force) to each of the pair of bearings 250 (e.g., a force applied to the outer surfaces 364 of the circular race rings 342 of bearings 250 by the contact surfaces 224 (such as surfaces 488) of the cam portions 230 of the torque applicator 220) which in turn transfers the force (e.g., at least an axial force) to the packaged device 215 via the compression plate apparatus 242 (e.g., the compression plate apparatus being coupled to the bearings 250 such that the compression plate apparatus moves axially along axis 211 with movement of the bearings 250).

All patents and references cited herein are incorporated in their entirety as if each were incorporated separately. The term bearing and bearing structure is used interchangeably herein. This disclosure has been described with reference to illustrative embodiments and is not meant to be construed in a limiting sense. As described previously, one skilled in the art will recognize that various other illustrative adapter assembly embodiments may be provided which utilize various combinations of the elements described herein. Various modifications of the illustrative embodiments, as well as additional embodiments of the disclosure and combinations of various elements herein, will be apparent to persons skilled in the art upon reference to this description. It is therefore contemplated that the patented claims will cover any such modifications or embodiments that may fall within the scope of the present disclosure as defined by the accompanying claims.

What is claimed is:

1. An adapter apparatus for use with a packaged device having a plurality of contact elements disposed on a surface thereof, the adapter apparatus comprising:

an adapter body defining a socket cavity configured to receive a packaged device such that the plurality of contact elements of the packaged device are at least aligned with arranged conductive elements corresponding thereto, wherein the adapter body defining the socket cavity configured to receive the packaged device comprises a threaded opening;

a torque applicator configured to apply an axial force, wherein the torque applicator comprises a contact surface, wherein the torque applicator comprises a threaded torque applicator extending along an axis of the adapter apparatus comprising a threaded portion configured to mate with the threaded opening of the adapter body for use in applying an axial force, and further wherein the threaded torque applicator terminates at the contact surface; and a compression assembly comprising a bearing structure positioned between the contact surface of the torque applicator and a packaged device when received in the socket cavity to transfer an axial force applied using the threaded torque applicator to the packaged device, wherein the bearing structure comprises a horizontal bearing defined about an axis thereof that lies in the same direction as the axis of the adapter apparatus.

2. A method of loading a packaged device in an adapter apparatus, wherein the packaged device comprises a plurality of contact elements disposed on a surface thereof, wherein the method comprises:

providing an adapter body defining a socket cavity configured to receive a packaged device, wherein the adapter body defines the socket cavity along an axis of the adapter apparatus;

providing a torque applicator to apply an axial force, wherein the torque applicator comprises a contact surface, wherein the torque applicator further comprises a hinged torque applicator coupled to the adapter body for use in applying an axial force, wherein the hinged torque applicator comprises a movable lever portion coupled to a pair of cam portions providing contact surfaces on opposing sides of the adapter body;

providing a compression assembly comprising a bearing structure positioned between the contact surface of the torque applicator and a packaged device when received in the socket cavity, wherein the bearing structure of the compression assembly comprises a pair of bearings with each bearing of the pair positioned between a contact surface of a cam portion and a packaged device when received in the socket cavity to transfer an axial force applied using the hinged torque applicator to the packaged device;

positioning a packaged device in the socket cavity such that the plurality of contact elements of the packaged device are at least aligned with arranged conductive elements corresponding thereto; and transferring an axial force applied using the torque applicator to the packaged device using the bearing structure, wherein transferring an axial force applied using the hinged torque applicator to the packaged device using the bearing structure comprises moving the movable lever portion of the hinged torque applicator to apply an axial force by each of the pair of cam portions to a respective bearing of the pair of bearings.

3. The method of claim 2, wherein each of the pair of bearings comprises a thrust bearing structure positioned to transfer an axial force applied using the hinged torque applicator to the packaged device when received in the socket cavity.

4. An adapter apparatus for use with a packaged device having a plurality of contact elements disposed on a surface thereof, the adapter apparatus comprising:

an adapter body defining a socket cavity configured to receive a packaged device such that the plurality of contact elements of the packaged device are at least aligned with arranged conductive elements corresponding thereto, wherein the adapter body defining the socket cavity configured to receive the packaged device comprises a threaded opening;

a torque applicator configured to apply an axial force, wherein the torque applicator comprises a contact surface, wherein the torque applicator comprises a threaded torque applicator extending along an axis of the adapter apparatus comprising a threaded portion configured to mate with the threaded opening of the adapter body for use in applying an axial force, and further wherein the threaded torque applicator terminates at the contact surface; and a compression assembly comprising a bearing structure positioned between the contact surface of the torque applicator and a packaged device when received in the socket cavity to transfer an axial force applied using the threaded torque applicator to the packaged device, wherein the bearing structure comprises a thrust bearing structure positioned to transfer an axial force applied using the torque applicator to the packaged device when received in the socket cavity.

5. The adapter apparatus of claim 4, wherein the thrust bearing structure comprises:

a first race comprising an inner surface and an outer surface opposite the inner surface;

a second race comprising an inner surface and an outer surface opposite the inner surface;

and a plurality of bearing elements positioned between the inner surface of the first race and the inner surface of the second race, wherein the outer surface of the first race is positioned to receive an axial force applied from the torque applicator, and further wherein the bearing structure transfers the force to the packaged device via the outer surface of the second race.

6. The adapter apparatus of claim 4, wherein the bearing structure comprises a rotary rolling element bearing structure positioned to transfer an axial force applied using the torque applicator to the packaged device when received in the socket cavity.

7. The adapter apparatus of claim 6, wherein the bearing structure comprises:

a first race ring having an inner surface comprising a first groove to receive a plurality of ball bearings and an outer planar surface opposite the inner surface;

a second race ring having an inner surface comprising a second groove to receive the plurality of ball bearings and an outer planar surface opposite the inner surface; and a bearing ring supporting a plurality of ball bearings, the plurality of ball bearings being held between the first race ring and the second race ring in the first groove and second groove thereof.

8. The adapter apparatus of claim 7, wherein the outer planar surface of the first race is positioned to receive an axial force applied from the contact surface of the torque applicator, and further wherein the bearing structure transfers the force to the packaged device via the outer planar surface of the second race.

9. An adapter apparatus for use with a packaged device having a plurality of contact elements disposed on a surface thereof, the adapter apparatus comprising:

an adapter body defining a socket cavity configured to receive a packaged device such that the plurality of contact elements of the packaged device are at least aligned with arranged conductive elements corresponding thereto, wherein the adapter body defining the socket cavity configured to receive the packaged device comprises a threaded opening;

a torque applicator configured to apply an axial force, wherein the torque applicator comprises a contact surface, wherein the torque applicator comprises a threaded torque applicator extending along an axis of the adapter apparatus comprising a threaded portion configured to mate with the threaded opening of the adapter body for use in applying an axial force, and further wherein the threaded torque applicator terminates at the contact surface; and a compression assembly comprising a bearing structure positioned between the contact surface of the torque applicator and a packaged device when received in the socket cavity to transfer an axial force applied using the threaded torque applicator to the packaged device, wherein the compression assembly further comprises a compression plate apparatus positioned between the bearing structure and a packaged device when received in the socket cavity such that an axial force applied using the torque applicator is transferred through the bearing structure and via the compression plate apparatus to the packaged device when received in the socket cavity.

10. The adapter apparatus of claim 9, wherein the compression plate apparatus comprises:

one or more plate elements forming a compression plate body having a first surface configured to contact a packaged device when received in the socket cavity and a second surface opposite the first surface; and a cavity defined in the second surface configured to receive the bearing structure, wherein at least a contact surface of the bearing structure extends beyond the second surface such that an axial force applied by the torque applicator to the compression assembly is applied to contact surface of the bearing structure instead of the second surface of the compression body.

11. The adapter apparatus of claim 4, wherein the adapter body defining a socket cavity comprises:

a socket base defining the socket cavity therein configured to receive a packaged device; and a socket lid to close the socket cavity hinged to the socket base, wherein the socket lid comprises the threaded opening for mating with the threaded portion of the threaded torque applicator.

12. The adapter apparatus of claim 4, wherein the threaded torque applicator comprises a handle for use in applying torque.

13. An adapter apparatus for use with a packaged device having a plurality of contact elements disposed on a surface thereof, the adapter apparatus comprising:

an adapter body defining a socket cavity configured to receive a packaged device such that the plurality of contact elements of the packaged device are at least aligned with arranged conductive elements corresponding thereto, wherein the adapter body defines the socket cavity along an axis of the adapter apparatus;

a torque applicator configured to apply an axial force, wherein the torque applicator comprises a contact surface, wherein the torque applicator comprises a hinged torque applicator coupled to the adapter body for use in applying an axial force, wherein the hinged torque applicator comprises a movable lever portion coupled to a pair of cam portions providing contact surfaces on opposing sides of the adapter body; and a compression assembly comprising a bearing structure positioned between the contact surface of the torque applicator and a packaged device when received in the socket cavity to transfer an axial force applied using the torque applicator to the packaged device, wherein the bearing structure of the compression assembly comprises a pair of bearings with each bearing of the pair positioned between a contact surface of a cam portion and a packaged device when received in the socket cavity to transfer an axial force applied using the hinged torque applicator to the packaged device.

14. The adapter apparatus of claim 13, wherein the pair of bearings comprises a pair of vertical bearings, each vertical bearing defined about an axis thereof which lies orthogonal to the axis of the adapter apparatus.

15. The adapter apparatus of claim 13, wherein each of the pair of bearings comprises a thrust bearing structure positioned to transfer an axial force applied using the hinged torque applicator to the packaged device when received in the socket cavity.

16. The adapter apparatus of claim 15, wherein each thrust bearing structure comprises:

a first circular race comprising an inner circular surface adjacent an axis extending therethrough and an outer circular surface opposite the inner circular surface;

a second circular race comprising an inner circular surface and an outer circular surface opposite the inner circular surface; and a plurality of bearing elements positioned between the outer circular surface of the first race and the inner surface of the second race, wherein the outer circular surface of the second circular race is positioned to receive an axial force applied from the hinged torque applicator, and further wherein the thrust bearing structure transfers the force to the packaged device via the inner circular surface of the first race.

17. The adapter apparatus of claim 15, wherein each thrust bearing structure comprises a rotary rolling element bearing structure positioned to transfer an axial force applied using the hinged torque applicator to the packaged device when received in the socket cavity.

18. The adapter apparatus of claim 13, wherein the compression assembly further comprises a compression plate apparatus coupled between the pair of bearings, wherein the compression plate apparatus comprises a surface configured to contact a packaged device when received in the socket cavity such that an axial force applied by the pair of cam portions of the hinged torque applicator is applied to the pair of bearings instead of directly to a surface of the compression plate apparatus.

19. The adapter apparatus of claim 18, wherein the adapter body defining a socket cavity comprises:

a socket base defining the socket cavity therein configured to receive a packaged device; and a socket lid to close the socket cavity hinged to the socket base, wherein the lever portion of the hinged torque applicator is movable relative to the socket lid to apply an axial force by the pair of cam portions to a packaged device when received in the socket cavity via the pair of bearings and the compression plate apparatus.

20. A method of loading a packaged device in an adapter apparatus, wherein the packaged device comprises a plurality of contact elements disposed on a surface thereof, wherein the method comprises:

providing an adapter body defining a socket cavity configured to receive a packaged device, wherein the adapter body comprises a threaded opening;

providing a torque applicator to apply an axial force, wherein the torque applicator comprises a contact surface, wherein the torque applicator comprises a threaded torque applicator extending along an axis of the adapter apparatus comprising a threaded portion configured to mate with the threaded opening of the adapter body for use in applying an axial force, and further wherein the torque applicator terminates at the contact surface;

providing a compression assembly comprising a bearing structure positioned between the contact surface of the torque applicator and a packaged device when received in the socket cavity;

positioning a packaged device in the socket cavity such that the plurality of contact elements of the packaged device are at least aligned with arranged conductive elements corresponding thereto; and transferring an axial force applied using the torque applicator to the packaged device using the bearing structure, wherein transferring the axial force comprises turning the threaded portion of the threaded torque applicator into the threaded opening of the adapter body and transferring an axial force applied using the threaded torque applicator to the packaged device using the bearing structure, wherein the bearing structure comprises a thrust bearing structure positioned to transfer the axial force applied using the torque applicator to the packaged device.

21. The method of claim 2, wherein the compression assembly further comprises a compression plate apparatus coupled between the pair of bearings, wherein the compression plate apparatus comprises a surface configured to contact a packaged device when received in the socket cavity such that an axial force applied by the pair of cam portions of the hinged torque applicator is transferred through the pair of bearings and via the compression plate apparatus to the packaged device.

22. The method of claim 2, wherein the adapter body defining a socket cavity comprises a socket base defining the socket cavity therein configured to receive a packaged device and a socket lid to close the socket cavity hinged to the socket base, and further wherein positioning a packaged device in the socket cavity comprises:

opening the socket lid and positioning a packaged device in the socket cavity such that the plurality of contact elements of the packaged device are at least aligned with arranged conductive elements corresponding thereto; and closing and latching the socket lid to the socket base.

23. The method of claim 20, wherein the thrust bearing structure comprises:

a first race comprising an inner surface and an outer surface opposite the inner surface;

a second race comprising an inner surface and an outer surface opposite the inner surface;

and a plurality of bearing elements positioned between the inner surface of the first race and the inner surface of the second race, wherein the outer surface of the first race is positioned to receive the force applied from the torque applicator, and further wherein the bearing structure transfers the force to the packaged device via the outer surface of the second race.

24. The method of claim 20, wherein the bearing structure comprises a rotary rolling element bearing structure positioned to transfer the axial force applied using the torque applicator to the packaged device when received in the socket cavity.

25. A method of loading a packaged device in an adapter apparatus, wherein the packaged device comprises a plurality of contact elements disposed on a surface thereof, wherein the method comprises:

providing an adapter body defining a socket cavity configured to receive a packaged device, wherein the adapter body comprises a threaded opening;

providing a torque applicator to apply an axial force, wherein the torque applicator comprises a contact surface, wherein the torque applicator comprises a threaded torque applicator extending along an axis of the adapter apparatus comprising a threaded portion configured to mate with the threaded opening of the adapter body for use in applying an axial force, and further wherein the torque applicator terminates at the contact surface;

providing a compression assembly comprising a bearing structure positioned between the contact surface of the torque applicator and a packaged device when received in the socket cavity;

positioning a packaged device in the socket cavity such that the plurality of contact elements of the packaged device are at least aligned with arranged conductive elements corresponding thereto; and transferring an axial force applied using the torque applicator to the packaged device using the bearing structure, wherein transferring the axial force comprises turning the threaded portion of the threaded torque applicator into the threaded opening of the adapter body and transferring an axial force applied using the threaded torque applicator to the packaged device using the bearing structure, wherein the compression assembly further comprises a compression plate apparatus positioned between the bearing structure and a packaged device received in the socket cavity such that the axial force applied using the torque applicator is transferred through the bearing structure and via the compression plate apparatus to the packaged device.

26. The method of claim 20, wherein providing the adapter body defining a socket cavity comprises providing a socket base defining the socket cavity therein configured to receive a packaged device and a socket lid to close the socket cavity hinged to the socket base, wherein the socket lid comprises the threaded opening for mating with the threaded portion of the threaded torque applicator, and further wherein positioning a packaged device in the socket cavity comprises:

opening the socket lid and positioning a packaged device in the socket cavity such that the plurality of contact elements of the packaged device are at least aligned with arranged conductive elements corresponding thereto; and closing and latching the socket lid to the socket base.

27. The method of claim 3, wherein each thrust bearing structure comprises:

a first circular race comprising an inner circular surface adjacent an axis extending therethrough and an outer circular surface opposite the inner circular surface;

a second circular race comprising an inner circular surface and an outer circular surface opposite the inner circular surface;

and a plurality of bearing elements positioned between the outer circular surface of the first race and the inner surface of the second race, wherein the outer circular surface of the second race is positioned to receive an axial force applied from a contact surface of a cam portion of the hinged torque applicator, and further wherein the thrust bearing structure transfers the force to the packaged device via the inner circular surface of the first race.

28. The method of claim 3, wherein each thrust bearing structure comprises a rotary rolling element bearing structure positioned to transfer an axial force applied using the hinged torque applicator to the packaged device when received in the socket cavity.

* * * * *